(12) United States Patent
Jeong

(10) Patent No.: US 9,190,562 B2
(45) Date of Patent: Nov. 17, 2015

(54) LIGHT EMITTING DEVICE

(71) Applicant: Hwan Hee Jeong, Seoul (KR)

(72) Inventor: Hwan Hee Jeong, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 20 days.

(21) Appl. No.: 14/067,192

(22) Filed: Oct. 30, 2013

(65) Prior Publication Data
US 2014/0124731 A1 May 8, 2014

(30) Foreign Application Priority Data

Nov. 2, 2012 (KR) .................. 10-2012-0123510

(51) Int. Cl.
| H01L 33/36 | (2010.01) |
| H01L 33/06 | (2010.01) |
| H01L 33/62 | (2010.01) |
| H01L 33/30 | (2010.01) |
| H01L 33/38 | (2010.01) |
| H01L 33/32 | (2010.01) |
| H01L 33/00 | (2010.01) |
| H01L 33/40 | (2010.01) |

(52) U.S. Cl.
CPC .............. *H01L 33/06* (2013.01); *H01L 33/002* (2013.01); *H01L 33/30* (2013.01); *H01L 33/32* (2013.01); *H01L 33/36* (2013.01); *H01L 33/38* (2013.01); *H01L 33/385* (2013.01); *H01L 33/62* (2013.01); *H01L 33/387* (2013.01); *H01L 33/405* (2013.01); *H01L 2933/0016* (2013.01)

(58) Field of Classification Search
None
See application file for complete search history.

(56) References Cited

U.S. PATENT DOCUMENTS

| 2003/0141506 | A1* | 7/2003 | Sano et al. ................ 257/78 |
| 2006/0118775 | A1* | 6/2006 | Nagai et al. ............... 257/13 |
| 2007/0081288 | A1* | 4/2007 | Kanazawa et al. ......... 361/118 |
| 2007/0181895 | A1 | 8/2007 | Nagai |
| 2009/0101923 | A1 | 4/2009 | Choi et al. ................ 257/89 |
| 2009/0294784 | A1* | 12/2009 | Nakahara et al. ......... 257/98 |
| 2010/0096652 | A1 | 4/2010 | Choi et al. ................ 257/98 |
| 2010/0163894 | A1* | 7/2010 | Uemura et al. ........... 257/95 |
| 2010/0171135 | A1 | 7/2010 | Engl et al. |

(Continued)

FOREIGN PATENT DOCUMENTS

| DE | 10017336 A1 | 10/2001 |
| EP | 1 733 439 A1 | 12/2006 |

(Continued)

OTHER PUBLICATIONS

Japanese Office Action dated Oct. 1, 2014 issued in Application No. 2013-228932.

(Continued)

*Primary Examiner* — Fei Fei Yeung Lopez
(74) *Attorney, Agent, or Firm* — Ked & Associates LLP

(57) ABSTRACT

A light emitting structure includes a first conductive semiconductor layer, an active layer under the first conductive semiconductor layer, and a second conductive semiconductor layer under the active layer. A plurality of first electrodes is provided on the first conductive semiconductor layer, and a second electrode electrically connects to the second conductive semiconductor layer. A conductive support member is provided under the second electrode, and a plurality of first connection parts is coupled the first electrodes to the conductive support member, respectively. A second connection part is coupled to the second electrode. The first electrodes are spaced apart from each other on a top surface of the first conductive semiconductor layer.

20 Claims, 17 Drawing Sheets

(56) References Cited

U.S. PATENT DOCUMENTS

| | | |
|---|---|---|
| 2011/0193121 A1 | 8/2011 | Jeong |
| 2011/0193123 A1 | 8/2011 | Moon et al. ............ 257/98 |
| 2011/0248237 A1 | 10/2011 | Choi et al. ............ 257/13 |
| 2012/0033409 A1 | 2/2012 | Jeong et al. |
| 2012/0235168 A1 | 9/2012 | Katsuno et al. .......... 257/88 |

FOREIGN PATENT DOCUMENTS

| | | |
|---|---|---|
| EP | 2 355 193 A2 | 8/2011 |
| JP | 2009-105376 A | 5/2009 |
| JP | 2010-103469 A | 5/2010 |
| JP | 2011-166150 A | 8/2011 |
| JP | 2011-223000 A | 11/2011 |
| JP | 2012-089846 A | 5/2012 |
| JP | 2012-138452 A | 7/2012 |
| JP | 2012-195321 A | 10/2012 |
| WO | WO 2005/091388 A1 | 9/2005 |

OTHER PUBLICATIONS

European Search Report issued in Application No. 13190949.1 dated Jul. 2, 2015.

\* cited by examiner

LIGHT EMITTING DEVICE

CROSS-REFERENCE TO RELATED APPLICATIONS

The present application claims priority under 35 U.S.C. 119 to Korean Patent Application No. 10-2012-0123510 filed on Nov. 2, 2012, which is hereby incorporated by reference in its entirety.

BACKGROUND

1. Field

The embodiment relates to a light emitting device, a light emitting device package, and a light unit.

2. Background

A light emitting diode (LED) has been extensively used as one of light emitting devices. The LED converts electrical signals into the form of light such as infra-red light, visible light and ultra-violet light by using the characteristic of a compound semiconductor.

As the light efficiency of the light emitting device is increased, the light emitting device has been used in various fields such as display apparatuses and lighting appliances.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Figure 1:
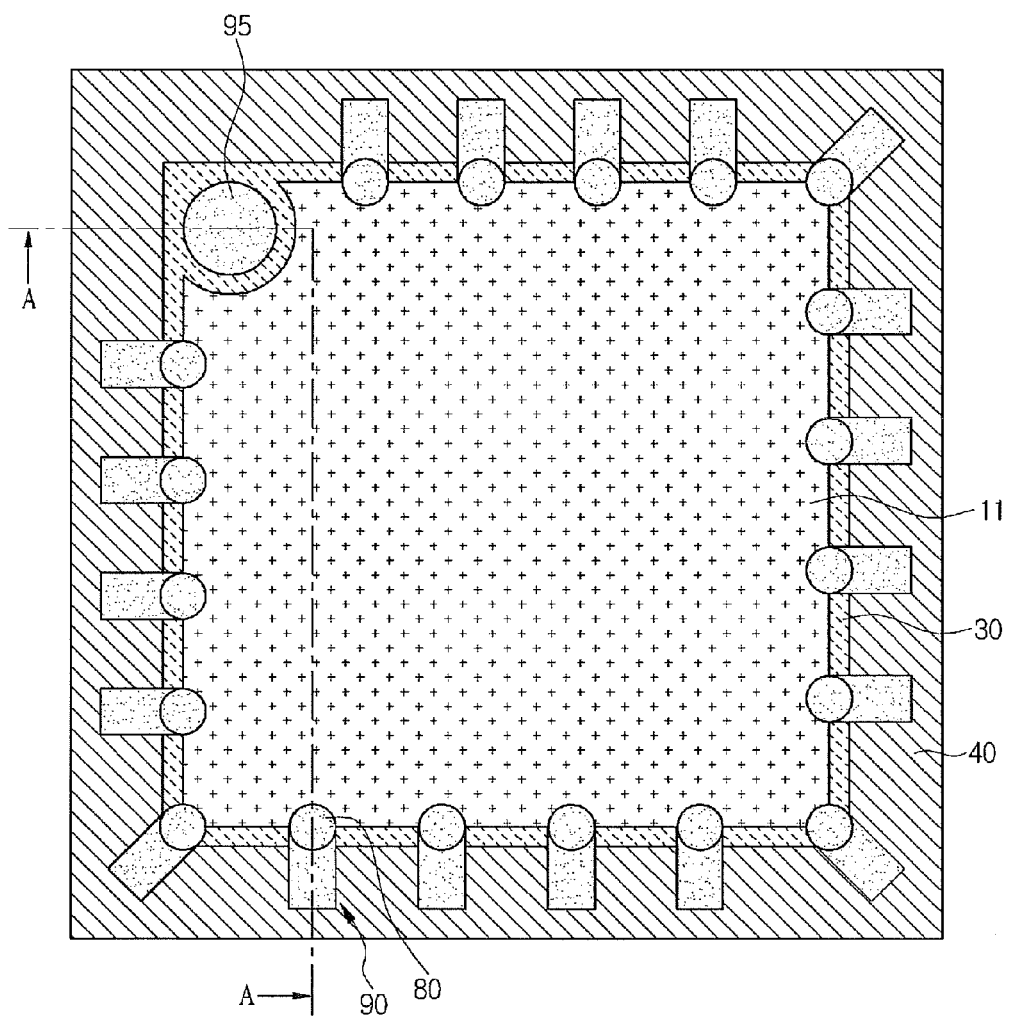
FIG. 1 is a view showing a light emitting device according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device, a light emitting device package, a light unit, and a method for fabricating the light emitting device according to the embodiments will be described in detail with reference to accompanying drawings.

Figure 2:
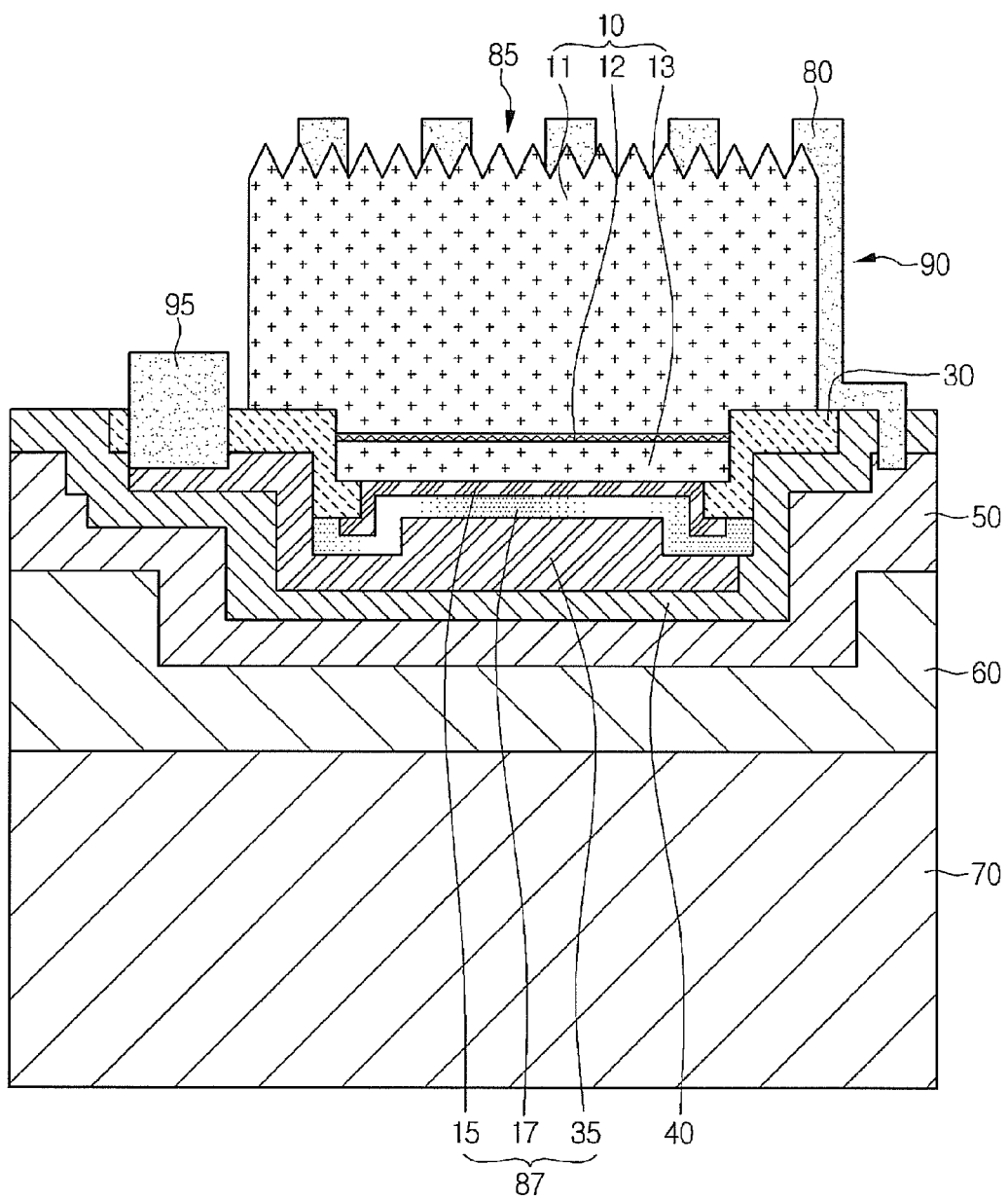
FIG. 2 is a sectional view taken along line A-A of a light emitting device shown in FIG. 1.

FIG. 1 is a view showing a light emitting device according to the embodiment, and FIG. 2 is a sectional view taken along line A-A of the light emitting device shown in FIG. 1.

As shown in FIGS. 1 and 2, the light emitting device according to the embodiment may comprise a light emitting structure 10, a conductive support member 70, a first electrode 80, and a second electrode 87.

The light emitting structure 10 may comprise a first conductive semiconductor layer 11, an active layer 12, and a second conductive semiconductor layer 13. The active layer 12 may be disposed between the first conductive semiconductor layer 11 and the second conductive semiconductor layer 13. The active layer 12 may be provided under the first conductive semiconductor layer 11, and the second conductive semiconductor layer 13 may be provided under the active layer 12.

The first conductive semiconductor layer 11 may comprise an N-type semiconductor layer doped with N-type dopants serving as first conductive dopants, and the second conductive semiconductor layer 13 may comprise a P-type semiconductor layer doped with P-type dopants serving as second conductive dopants. In addition, the first conductive semiconductor layer 11 may comprise a P-type semiconductor layer, and the second conductive semiconductor layer 13 may comprise an N-type semiconductor layer.

For example, the first conductive semiconductor layer 11 may comprise an N-type semiconductor layer. The first conductive semiconductor layer 11 may be realized by using a compound semiconductor. The first conductive semiconductor layer 11 may be realized by using a group II-VI compound semiconductor, or a group III-V compound semiconductor.

For example, the first conductive semiconductor layer 11 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11 may comprise one selected from the group consisting of GaN, AlN, AlGaN, InGaN, InN, InAlGaN, AlInN, AlGaAs, GaP, GaAs, GaAsP, and AlGaInP doped with N-type dopants such as Si, Ge, Sn, Se, and Te.

The active layer 12 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a compound semiconductor. The active layer 12 may be realized by using a semiconductor material having a compositional formula of $In_xAl_yGa_{1-x-y}N$ ($0 \leq x \leq 1$, $0 \leq y \leq 1$, $0 \leq x+y \leq 1$). When the active layer 12 has an MQW structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may comprise a P-type semiconductor layer. The second conductive semiconductor layer 13 may be realized by using a compound semiconductor. For example, the second conductive semiconductor layer 13 may be realized by using a group II-VI compound semiconductor, or a group II-V compound semiconductor.

For example, the second conductive semiconductor layer 13 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 13 may comprise one selected from the group consisting of GaN, AlN, AlGaN, InGaN, InN, InAlGaN, AlInN, AlGaAs, GaP, GaAs, GaAsP, and AlGaInP doped with P-type dopants such as Mg, Zn, Ca, Sr, and Ba.

Meanwhile, the first conductive semiconductor layer 11 may comprise a P-type semiconductor layer and the second conductive semiconductor layer 13 may comprise the N-type semiconductor layer. In addition, a semiconductor layer comprising an N-type or P-type semiconductor layer may be additionally provided under the second conductive semiconductor layer 13. Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 13 with uniform or non-uniform doping concentration. In other words, the light emitting structure 10 may have various structures, but the embodiment is not limited thereto.

In addition, a first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 13.

The light emitting device according to the embodiment may comprise a channel layer 30 provided at a peripheral portion of a lower portion of the light emitting structure 10. For example, a top surface of the channel layer 30 may be provided higher than a top surface of the active layer 12. The channel layer 30 may surround the active layer 12. The channel layer 30 may surround a peripheral portion of the second conductive semiconductor layer 13. One end of the channel layer 30 may be provided under the second conductive semiconductor layer 13. The one end of the channel layer 30 may make contact with a bottom surface of the second conductive semiconductor layer 13. The one end of the channel layer 30 may be disposed between the second conductive semiconductor layer 13 and the second electrode 87. The one end of the channel layer 30 may be disposed between the second conductive semiconductor layer 13 and a reflective layer 17.

For example, the channel layer 30 may be realized by using an oxide or a nitride. For example, the channel layer 30 may comprise at least one selected from the group consisting of $SiO_2$, $Si_xO_y$, $Si_3N_4$, $Si_xN_y$, $SiO_xN_y$, $Al_2O_3$, $TiO_2$, and AlN. The channel layer 30 may be referred to as an isolation layer. The channel layer 30 may serve as an etching stopper when an isolation process is performed with respect to the light emitting structure 10 thereafter. In addition, through the isolation process, the electrical characteristic of the light emitting device can be prevented from being degraded.

The first electrode 80 may be electrically connected to the first conductive semiconductor layer 11. The first electrode 80 may be provided on the first conductive semiconductor layer 11. The first electrode 80 may make contact with the first conductive semiconductor layer 11.

A plurality of first electrodes 80 may be provided. In this case, the first electrodes 80 are spaced apart from each other on the top surface of the light emitting structure 10. In addition, the first electrodes 80 may be spaced apart from each other on the top surface of the first conductive semiconductor layer 11. The first electrodes 80 may be arranged in the form of dots on the first conductive semiconductor layer 11. Further, the first electrodes 80 may be formed on the first conductive semiconductor layer 11 with a width in the range of few micrometers to several tens of micrometers.

The first electrodes 80 may be arranged around the first conductive semiconductor layer 11. The first electrodes 80 may be arranged at an outer peripheral portion of the top surface of the first conductive semiconductor layer 11. The first electrodes 80 adjacent to each other may be spaced apart from each other by a distance of 100 μm to 500 μm.

The reflective layer 17 may be electrically connected to the second conductive semiconductor layer 13. The reflective layer 17 may be provided under the light emitting structure 10. The reflective layer 17 may be provided under the second conductive semiconductor layer 13.

The light emitting device according to the embodiment may comprise an ohmic contact layer 15 disposed between the reflective layer 17 and the second conductive semiconductor layer 13. The ohmic contact layer 15 may contact with the second conductive semiconductor layer 13.

The ohmic contact layer 15 may make ohmic contact with the light emitting structure 10. The ohmic contact layer 15 may comprise an ohmic contact region with the light emitting structure 10. The reflective layer 17 may be electrically connected to the second conductive semiconductor layer 13. In addition, the reflective layer 17 reflects light incident thereto from the light emitting structure 10 to increase the quantity of light extracted to an outside.

For example, the ohmic contact layer 15 may comprise a transparent conductive oxide layer. For example, the ohmic contact layer 15 may comprise at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, and Ti.

The reflective layer 17 may comprise a material having high reflectance. For example, the reflective layer 17 may comprise metal including at least one of Ag, Ni, Al, Rh, Pd, Ir, Ru, Mg, Zn, Pt, Cu, Au, and Hf, and the alloy thereof. In addition, the reflective layer 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective layer 17 may comprise at least one of Ag, Al, an Ag—Pd—Cu alloy, and an Ag—Cu alloy.

For example, the reflective layer 17 may have a structure in which an Ag layer and a Ni layer are alternately formed, and may comprise Ni/Ag/Ni or a Tl layer, and a Pt layer. In addition, the ohmic contact layer 15 may be provided under the reflective layer 17, and at least a portion of the ohmic contact layer 15 may make ohmic contact with the light emitting structure 10 through the reflective layer 17.

The light emitting device according to the embodiment may comprise a first metal layer 35 provided under the reflective layer 17. The first metal layer 35 may comprise at least one of Au, Cu, Ni, Ti, Ti—W, Cr, W, Pt, V, Fe, and Mo.

According to the embodiment, the second electrode 87 may comprise at least one of the reflective layer 17, the ohmic contact layer 15, and the first metal layer 35. For example, the second electrode 87 may comprise all of the reflective layer 17, the first metal layer 35, and the ohmic contact layer 15, or may comprise one or two selected from the of the reflective layer 17, the first metal layer 35, and the ohmic contact layer 15.

The light emitting device according to the embodiment may comprise a second metal layer 50 provided under the first metal layer 35.

The second metal layer 50 may comprise at least one of Cu, Ni, Ti, Ti—W, Cr, W, Pt, V, Fe, and Mo. The second metal layer 50 may serve as a diffusion barrier layer. A bonding layer 60 and the conductive support member 70 may be provided under the second metal layer 50.

The second metal layer 50 may prevent a material included in the bonding layer 60 from being diffused to the reflective layer 17 in the process of providing the bonding layer 60. The second metal layer 50 may prevent a material, such as zinc (Sn), included in the bonding layer 60 from exerting an influence on the reflective layer 17.

The bonding layer 60 comprises barrier metal or bonding metal. For example, the bonding layer 60 may comprise at least one of Ti, Au, Sn, Ni, Cr, Ga, In, Bi, Cu, Ag, Nb, Pd and Ta. The conductive support member 70 may support the light emitting structure 10 according to the embodiment while performing a heat radiation function. The bonding layer 60 may be realized in the form of a seed layer.

The conductive support member 70 may comprise at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

According to the embodiment, power may be applied to the light emitting structure 10 through the second electrode 87 and the first electrode 80. According to the embodiment, the first electrode 80 may comprise an ohmic layer, an intermediate layer, and an upper layer. The ohmic layer may comprise a material selected from the group consisting of Cr, V, W, Ti, and Zn, and may make ohmic contact. The intermediate layer may be realized by using a material selected from the group consisting of Ni, Cu, and Al. For example, the upper layer may comprise Au. The first electrode 80 may comprise at least one selected from the group consisting of Cr, V, W, Ti, Zn, Ni, Cu, Al, Au, and Mo.

A roughness 85 may be formed on the top surface of the first conductive semiconductor layer 11. Accordingly, the quantity of light extracted upward at the region where the roughness 85 is formed can be increased.

The light emitting device according to the embodiment may comprise an insulating layer 40 disposed between the first metal layer 35 and the second metal layer 50. The insulating layer 40 may insulate the first metal layer 35 from the second metal layer 50. The insulating layer 40 may insulate the first metal layer 35 from the conductive support member 70. For example, the insulating layer 40 may be realized by using an oxide or a nitride. For example, the insulating layer 40 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The insulating layer 40 may surround a peripheral portion of the first metal layer 35. A portion of the insulating layer 40 may make contact with the lateral side of the reflective layer 17. The top surface of the insulating layer 40 may be exposed to a peripheral portion of the lower portion of the light emitting structure 10. The insulating layer 40 may surround a peripheral portion of the channel layer 30.

The light emitting device according to the embodiment may comprise a first connection part 90 and a second connection part 95. The first connection part 90 may be electrically connected to the first electrode 80 and the conductive support member 70. A plurality of first connection parts 90 may be provided. Each of the first connection parts 90 may electrically connect the first electrodes 80 to the conductive support member 70. The second connection part 95 may be electrically connected to the reflective layer 17. The second connection part 95 may be electrically connected to the second electrode 87.

The first connection parts 90 may make contact with the first electrodes 80, respectively. The first connection parts 90 may be electrically connected to the second metal layer 50. The first connection part 90 may make contact with the second metal layer 50. The first connection part 90 may be electrically connected to the conductive support member 70 through the second metal layer 50 and the bonding layer 60.

The first connection parts 90 may be arranged at a lateral side of the light emitting structure 10. The first connection parts 90 may be spaced apart from each other. The first connection parts 90 may be arranged at a lateral side of the first conductive semiconductor layer 11 with a width in the range of few micrometers to several tens of micrometers.

The first connection parts 90 may be arranged at the lateral side of the first conductive semiconductor layer 11. The first connection parts 90 adjacent to each other may be spaced apart from each other by a distance of 100 μm to 500 μm.

The first connection part 90 may be provided through the insulating layer 40. The first connection part 90 may be electrically connected to the conductive support member 70 through the insulating layer 40. In addition, the first connection part 90 may be electrically connected to the second metal layer 50 through the channel layer 30. The first connection part 90 may be electrically connected to the second metal layer 50 through the channel layer 30 and the insulating layer 40.

The first connection part 90 may be provided at the lateral side of the light emitting structure 10. The first connection part 90 may be provided at the lateral side of the first conductive semiconductor layer 11. The first connection part 90 may make contact with the lateral side of the first conductive semiconductor layer 11. The channel layer 30 may insulate the first connection part 90 from the active layer 12. The channel layer 30 may insulate the first connection part 90 from the second conductive semiconductor layer 13. The first connection part 90 may be spaced apart from the active layer 12 by a distance of at least 3 μm.

The second connection part 95 may be electrically connected to the first metal layer 35. The second connection part 95 may make contact with the first metal layer 35. One end of the second connection part 95 may be provided on the channel layer 30. The one end of the second connection part 95 may be spaced apart from the lateral side of the light emitting structure 10. The one end of the second connection part 95 may be exposed to the lateral side of the light emitting structure 10.

The second connection part 95 may be electrically connected to the first metal layer 35 through the channel layer 30. In addition, the second connection part 95 may be electrically connected to the first metal layer 35 through the insulating layer 40. The second connection part 95 may be electrically connected to the second electrode 87. The second connection part 95 may make contact with the second electrode 87.

The first connection part 90 and the second connection part 95 may comprise at least one of Cr, V, W, Ti, Zn, Ni, Pt, Cu, Al, Au, and Mo.

In the light emitting device according to the embodiment, the conductive support member 70 provided under the second electrode 87 may be electrically connected to the first conductive semiconductor layer 11 provided on the second electrode 87.

Accordingly, power may be supplied to the first conductive semiconductor layer 11 through a scheme of attaching the conductive support member 70 to the bonding pad. According to the embodiment, the second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

In addition, according to the embodiment, the first electrodes 80 may be arranged in the form of dots at an outer peripheral region of the top surface of the light emitting structure 10, so that the light emission area can be expanded. According to the light emitting device of the embodiment, light absorption in the first electrode 80 may be reduced, so that the light efficiency can be improved.

Hereinafter, a method of fabricating the light emitting device according to the embodiment will be described with reference to FIGS. 3 to 7.

Figure 3:
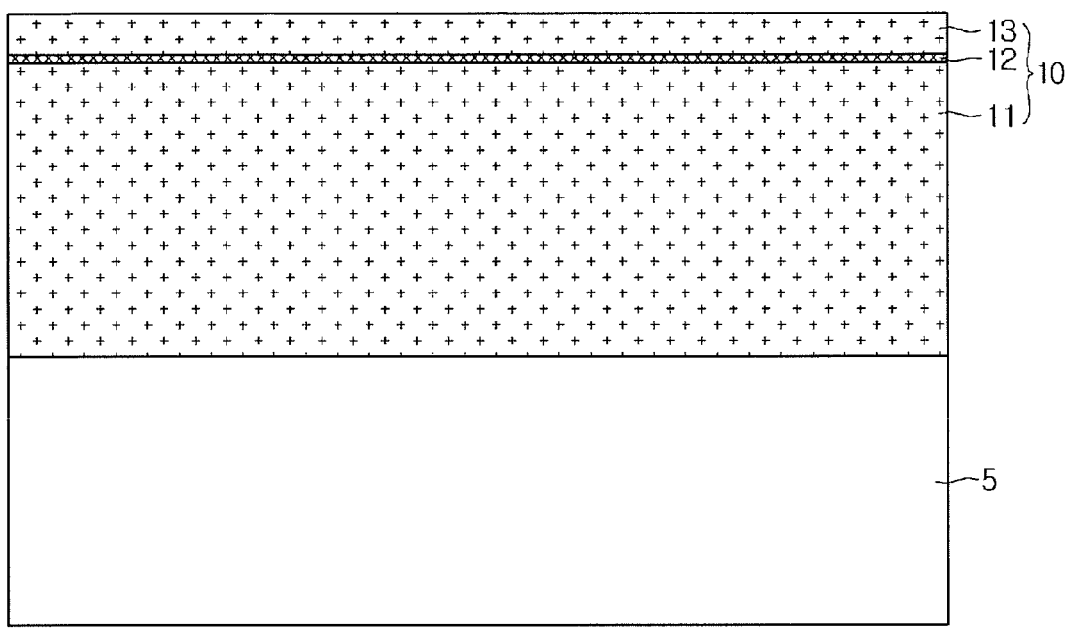
FIGS. 3 to 7 are sectional views showing a method of fabricating a light emitting device.

According to the method of fabricating the light emitting device of the embodiment, as shown in FIG. 3, the first conductive semiconductor layer 11, the active layer 12, and the second conductive semiconductor layer 13 may be formed on a substrate 5. The first conductive semiconductor layer 11, the active layer 12, and the second conductive semiconductor layer 13 may be defined as the light emitting structure 10.

For example, the substrate 5 may comprise at least one of a sapphire substrate ($Al_2O_3$), SiC, GaAs, GaN, ZnO, Si, GaP, InP, and Ge, but the embodiment is not limited thereto. A buffer layer may be disposed between the first conductive semiconductor layer 11 and the substrate 5.

The first conductive semiconductor layer 11 may comprise an N-type semiconductor layer doped with N-type dopants serving as first conductive dopants, and the second conductive semiconductor layer 13 may comprise a P-type semiconductor layer doped with P-type dopants serving as second conductive dopants. In addition, the first conductive semiconductor layer 11 may comprise a P-type semiconductor layer, and the second conductive semiconductor layer 13 may comprise an N-type semiconductor layer.

For example, the first conductive semiconductor layer 11 may comprise an N-type semiconductor. The first conductive semiconductor layer 11 may comprise a semiconductor material having a compositional formula of $In_xAl_yGa_{1-x-y}N$ ($0 \leq x \leq 1$, $0 \leq y \leq 1$, $0 \leq x+y \leq 1$). For example, the first conductive semiconductor layer 11 may comprise one selected from the group consisting of InAlGaN, GaN, AlGaN, AlInN, InGaN, AlN, and InN, and may be doped with N-type dopants such as Si, Ge, Sn, Se, and Te.

The active layer 12 emits light having a wavelength corresponding to the energy band gap difference according to materials constituting the active layer 13 through the combination of electrons (or holes) injected through the first conductive semiconductor layer 11 and holes (or electrons) injected through the second conductive semiconductor layer 13. The active layer 12 may have one of a single quantum well (SQW) structure, a multi-quantum well (MQW) structure, a quantum dot structure, and a quantum wire structure, but the embodiment is not limited thereto.

The active layer 12 may be realized by using a semiconductor material having a compositional formula of $In_xAl_yGa_{1-x-y}N$ ($0 \leq x \leq 1$, $0 \leq y \leq 1$, $0 \leq x+y \leq 1$). When the active layer 12 has an MQW structure, the active layer 12 may be formed by stacking a plurality of well layers and a plurality of barrier layers. For example, the active layer 12 may have a cycle of InGaN well layer/GaN barrier layer.

For example, the second conductive semiconductor layer 13 may be realized by using a P type semiconductor. The second conductive semiconductor layer 13 may be realized by using a semiconductor material having a compositional formula of $In_xAl_yGa_{1-x-y}N$ ($0 \leq x \leq 1$, $0 \leq y \leq 1$, $0 \leq x+y \leq 1$). For example, the second conductive semiconductor layer 13 may comprise one selected from the group consisting of InAlGaN, GaN, AlGaN, InGaN, AlInN, AlN, and InN, and may be doped with P-type dopants such as Mg, Zn, Ca, Sr, and Ba.

Meanwhile, the first conductive semiconductor layer 11 may comprise a P-type semiconductor layer and the second conductive semiconductor layer 13 may comprise the N-type semiconductor layer. In addition, a semiconductor layer comprising an N-type or P-type semiconductor layer may be additionally provided on the second conductive semiconductor layer 13. Accordingly, the light emitting structure 10 may have at least one of an NP junction structure, a PN junction structure, an NPN junction structure, or a PNP junction structure. In addition, impurities may be doped into the first conductive semiconductor layer 11 and the second conductive semiconductor layer 15 with uniform or non-uniform doping concentration. In other words, the light emitting structure 10 may have various structures, but the embodiment is not limited thereto.

In addition, the first conductive InGaN/GaN superlattice structure or InGaN/InGaN superlattice structure may be formed between the first conductive semiconductor layer 11 and the active layer 12. In addition, a second conductive AlGaN layer may be formed between the second conductive semiconductor layer 13 and the active layer 13.

Figure 4:
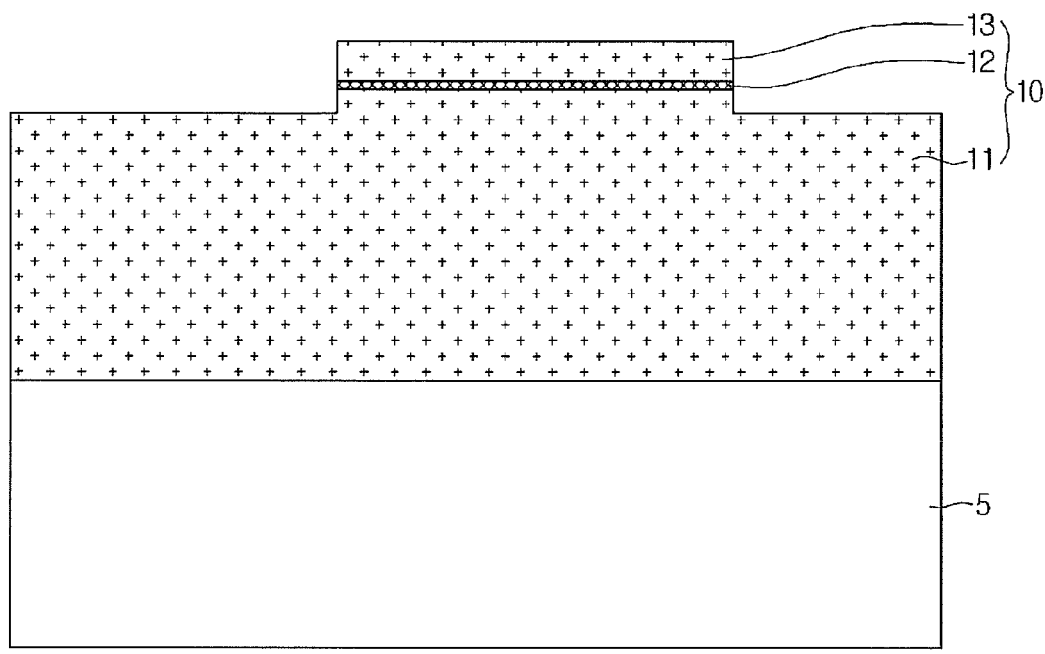

Next, as shown in FIG. 4, a portion of the first conductive semiconductor layer 11 may be exposed by performing an etching scheme for the light emitting structure 10. In this case, the etching may comprise a wet etching scheme or a dry etching scheme.

Figure 5:
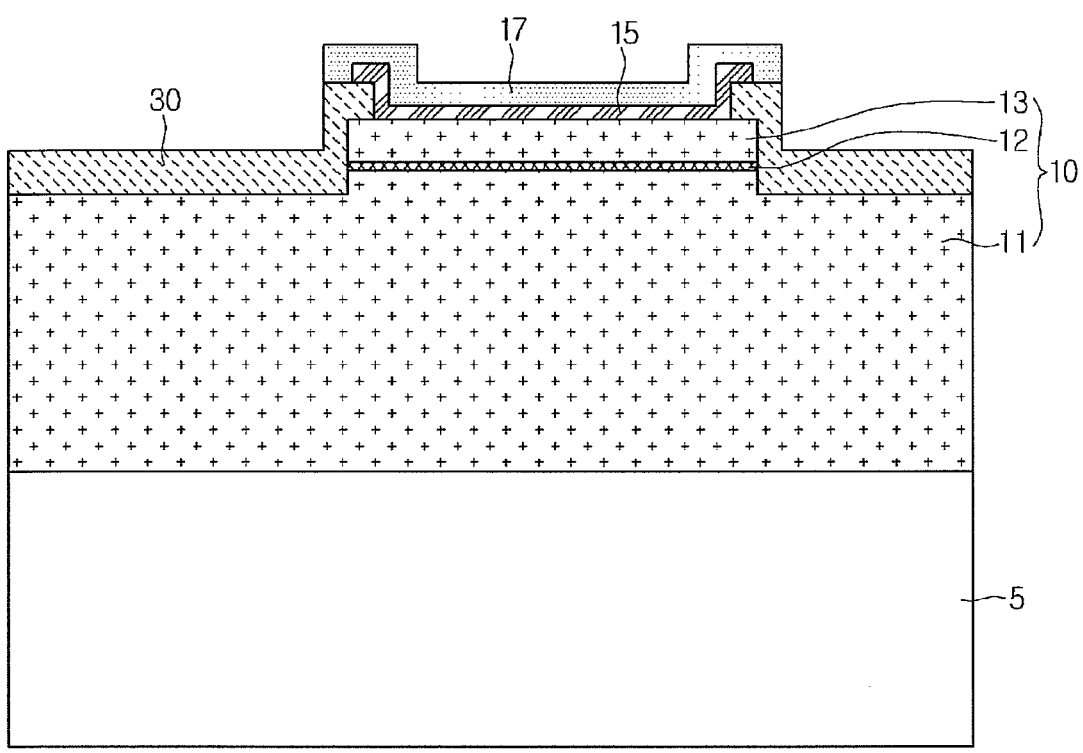
Figure 6:
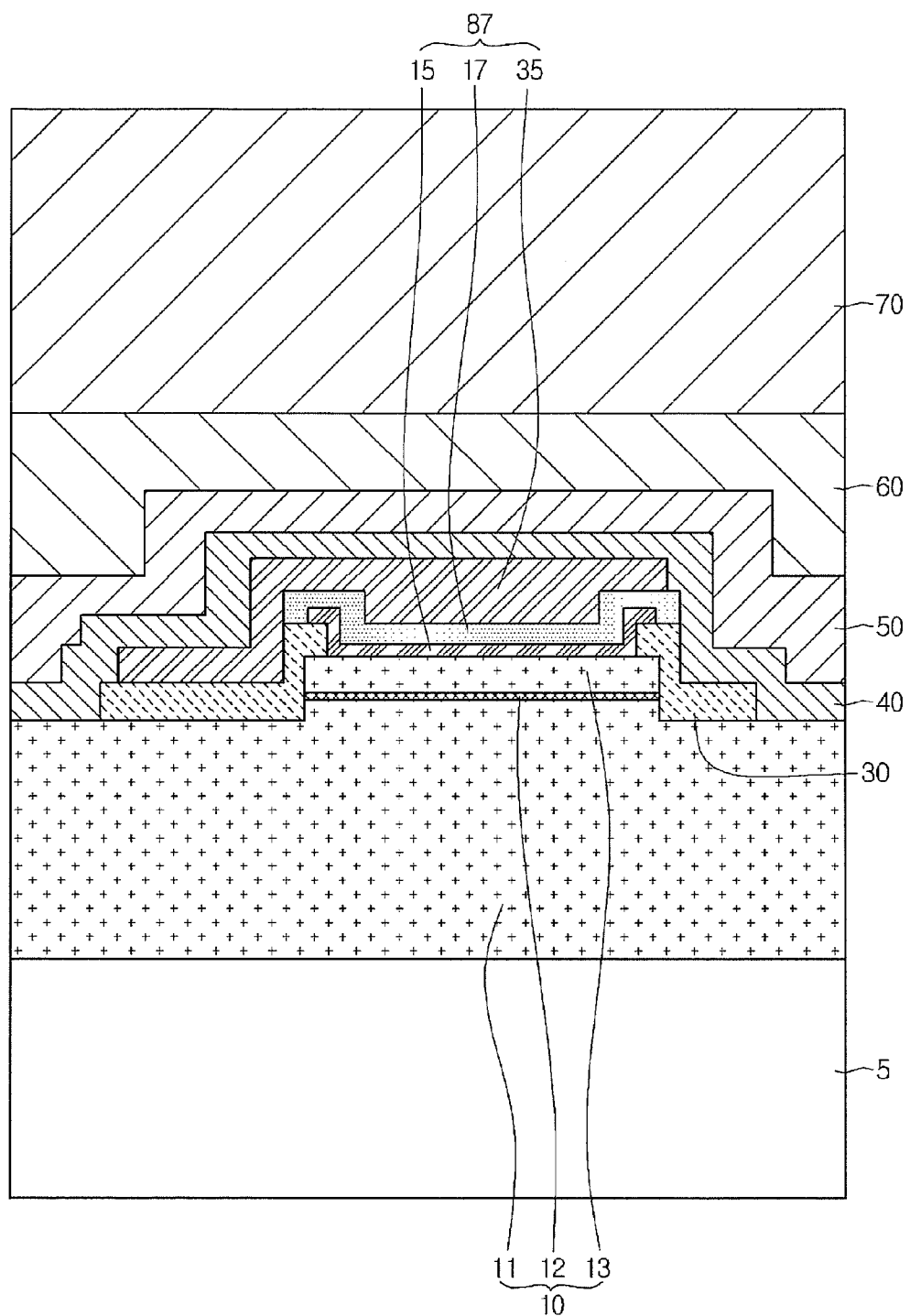

Then, as shown in FIG. 5, the light emitting structure 10 may be provided therein with the channel layer 30, the ohmic contact layer 15, and the reflective layer 17.

For example, the channel layer 30 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The ohmic contact layer 15 may be disposed between the reflective layer 17 and the second conductive semiconductor layer 13. The ohmic contact layer 15 may make contact with the second conductive semiconductor layer 13.

The ohmic contact layer 15 may make ohmic-contact with the light emitting structure 10. The reflective layer 17 may be electrically connected to the second conductive semiconductor layer 13. The ohmic contact layer 15 may comprise an ohmic-contact region that makes ohmic-contact with the light emitting structure 10.

For example, the ohmic contact layer 15 may comprise a transparent conductive oxide layer. For example, the ohmic contact layer 15 may comprise at least one selected from the group consisting of an ITO (Indium Tin Oxide), an IZO (Indium Zinc Oxide), an AZO (Aluminum Zinc Oxide), an AGZO (Aluminum Gallium Zinc Oxide), an IZTO (Indium Zinc Tin Oxide), an IAZO (Indium Aluminum Zinc Oxide), an IGZO (Indium Gallium Zinc Oxide), an IGTO (Indium Gallium Tin Oxide), an ATO (Antimony Tin Oxide), a GZO (Gallium Zinc Oxide), an IZON (IZO Nitride), ZnO, IrOx, RuOx, NiO, Pt, Ag, and Ti.

The reflective layer 17 may comprise a material having high reflectance. For example, the reflective layer 17 may comprise metal including at least one of Ag, Ni, Al, Rh, Pd, Ir, Ru, Mg, Zn, Pt, Cu, Au, and Hf, and the alloy thereof. In addition, the reflective layer 17 may be formed in a multi-layer of the metal or the alloy thereof and a transmissive conductive material such as an ITO (Indium-Tin-Oxide), an IZO (Indium-Zinc-Oxide), an IZTO (Indium-Zinc-Tin-Oxide), an IAZO (Indium-Aluminum-Zinc-Oxide), an IGZO (Indium-Gallium-Zinc-Oxide), an IGTO (Indium-Gallium-Tin-Oxide), an AZO (Aluminum-Zinc-Oxide), or an ATO (Antimony-Tin-Oxide). For example, according to the embodiment, the reflective layer 17 may comprise at least one of Ag, Al, an Ag—Pd—Cu alloy, and an Ag—Cu alloy.

For example, the reflective layer 17 may have a structure in which an Ag layer and a Ni layer are alternately formed, and may comprise Ni/Ag/Ni or a Tl layer, and a Pt layer. In addition, the ohmic contact layer 15 may be provided under the reflective layer 17, and at least a portion of the ohmic contact layer 15 may make ohmic-contact with the light emitting structure 10 through the reflective layer 17.

Thereafter, as shown in FIG. 5, the first metal layer 35, the insulating layer 40, the second metal layer 50, the bonding layer 60, and the conductive support member 70 may be formed on the reflective layer 17.

The first metal layer 35 may comprise at least one selected from the group consisting of Au, Cu, Ni, Ti, Ti—W, Cr, W, Pt, V, Fe, and Mo.

According to the embodiment, the second electrode 87 may comprise at least one of the reflective layer 17, the ohmic contact layer 15, and the first metal layer 35.

The insulating layer 40 may insulate the first metal layer 35 from the second metal layer 50. The insulating layer 40 may insulate the first metal layer 35 from the conductive support member 70.

The insulating layer 40 may be realized by using an oxide or a nitride. For example, the insulating layer 40 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The insulating layer 40 may surround a peripheral portion of the first metal layer 35. A portion of the insulating layer 40 may make contact with the lateral side of the reflective layer 17. The insulating layer 40 may surround a peripheral portion of the channel layer 30.

The second metal layer 50 may comprise at least one of Cu, Ni, Ti, Ti—W, Cr, W, Pt, V, Fe, and Mo. The second metal layer 50 may serve as a diffusion barrier layer.

The second metal layer 50 may prevent a material included in the bonding layer 60 from being diffused to the reflective layer 17 in the process of providing the bonding layer 60. The second metal layer 50 may prevent a material, such as zinc (Sn), included in the bonding layer 60 from exerting an influence on the reflective layer 17.

The bonding layer 60 comprises barrier metal or bonding metal. For example, the bonding layer 60 may comprise at least one of Ti, Au, Sn, Ni, Cr, Ga, In, Bi, Cu, Ag, Nb, Pd and Ta. The conductive support member 70 may support the light emitting structure 10 according to the embodiment while performing a heat radiation function. The bonding layer 60 may be realized in the form of a seed layer.

The conductive support member 70 may comprise at least one of semiconductor substrates (e.g., Si, Ge, GaN, GaAs, ZnO, SiC, and SiGe substrates) implanted with Ti, Cr, Ni, Al, Pt, Au, W, Cu, Mo, Cu—W, or impurities.

Next, the substrate 5 is removed from the first conductive semiconductor layer 11. According to one example, the substrate 5 may be removed through a laser lift off (LLO) process. The LLO process is a process to delaminate the substrate 5 from the first conductive semiconductor layer 11 by irradiating a laser to the bottom surface of the substrate 5.

Figure 7:
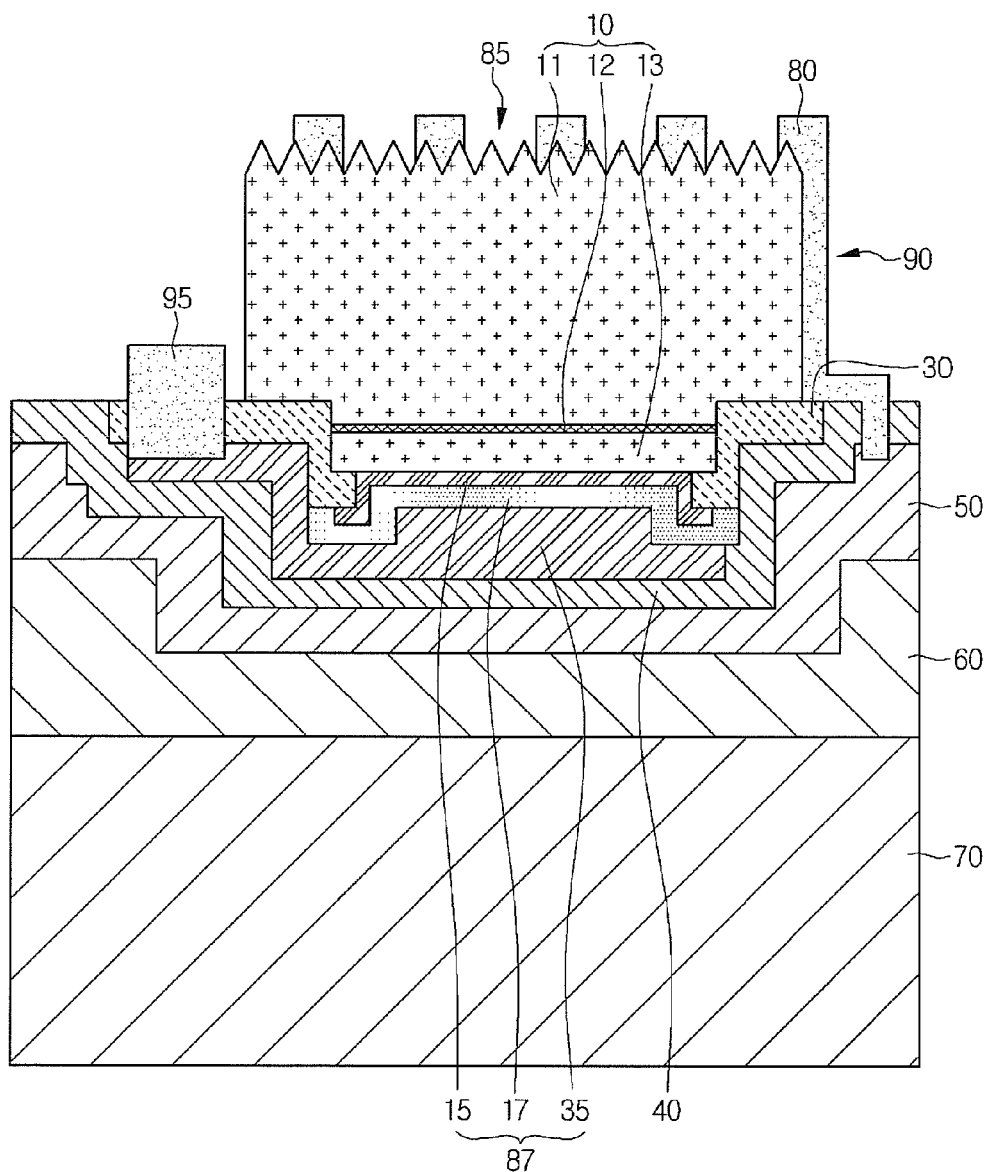

In addition, as shown in FIG. 7, the lateral side of the light emitting structure 10 is etched through an isolation etching process to expose a portion of the channel layer 30. In this case, a portion of the insulating layer 40 may be exposed. The isolation etching process may be performed through a dry etching process such as an inductively coupled plasma (ICP), but the embodiment is not limited thereto.

The roughness 85 may be formed on the top surface of the first conductive semiconductor layer 11. Accordingly, a light extraction pattern may be provided on the light emitting structure 10. A concave-convex pattern may be provided on the light emitting structure 10. For example, the light extraction pattern provided on the light emitting structure 10 may be formed through a PEC (photo electro chemical) etching process. Therefore, according to the embodiment, the external light extraction effect can be increased.

Next, as shown in FIG. 7, the light emitting structure 10 may be provided thereon with the first electrode 80, the first connection part 90, and the second connection part 95.

The first electrode 80 may be electrically connected to the first conductive semiconductor layer 11. A portion of the first electrode 80 may make contact with the first conductive semiconductor layer 11. According to the embodiment, power may be applied to the light emitting structure 10 through the first electrode 80 and the second electrode 87.

The first electrode 80 may comprise an ohmic layer, an intermediate layer, and an upper layer. The ohmic layer may comprise a material selected from the group consisting of Cr, V, W, Ti, and Zn, and may make ohmic contact. The intermediate layer may be realized by using a material selected from the group consisting of Ni, Cu, and Al. For example, the upper layer may comprise Au. The first electrode 80 may comprise at least one selected from the group consisting of Cr, V, W, Ti, Zn, Ni, Cu, Al, and Au.

A plurality of first electrodes 80 may be provided. In this case, the first electrodes 80 are spaced apart from each other on the top surface of the light emitting structure 10. In addition, the first electrodes 80 may be spaced apart from each other on the top surface of the first conductive semiconductor layer 11. The first electrodes 80 may be arranged in the form of dots on the first conductive semiconductor layer 11. Further, the first electrodes 80 may be formed on the first conductive semiconductor layer 11 with a width in the range of few micrometers to several tens of micrometers.

The first electrodes 80 may be arranged around the first conductive semiconductor layer 11. The first electrodes 80 may be arranged at an outer peripheral portion of the top surface of the first conductive semiconductor layer 11. The first electrodes 80 adjacent to each other may be spaced apart from each other by a distance of 100 μm to 500 μm.

A plurality of first connection parts 90 may be provided. Each of the first connection parts 90 may electrically connect the first electrodes 80 to the conductive support member 70. The second connection part 95 may be electrically connected to the reflective layer 17. The second connection part 95 may be electrically connected to the second electrode 87.

The first connection parts 90 may make contact with the first electrodes 80, respectively. The first connection parts 90 may be electrically connected to the second metal layer 50.

The first connection part 90 may make contact with the second metal layer 50. The first connection part 90 may be electrically connected to the conductive support member 70 through the second metal layer 50 and the bonding layer 60.

The first connection parts 90 may be arranged at a lateral side of the light emitting structure 10. The first connection parts 90 may be spaced apart from each other. The first connection parts 90 may be arranged at a lateral side of the first conductive semiconductor layer 11 with a width in the range of few micrometers to several tens of micrometers.

The first connection parts 90 may be arranged at the lateral side of the first conductive semiconductor layer 11. The first connection parts 90 adjacent to each other may be spaced apart from each other by a distance of 100 μm to 500 μm.

The first connection part 90 may be electrically connected to the conductive support member 70 through the second metal layer 50 and the bonding layer 60. The first connection part 90 may be provided through the insulating layer 40. The first connection part 90 may be electrically connected to the conductive support member 70 through the insulating layer 40. The first connection part 90 may be electrically connected to the second metal layer 50 through the channel layer 30.

The first connection part 90 may be provided at the lateral side of the light emitting structure 10. The first connection part 90 may be provided at the lateral side of the first conductive semiconductor layer 11. The first connection part 90 may make contact with the lateral side of the first conductive semiconductor layer 11. The channel layer 30 may insulate the first connection part 90 from the active layer 12. The channel layer 30 may insulate the first connection part 90 from the second conductive semiconductor layer 13. The first connection part 90 may be spaced apart from the active layer 12 by a distance of at least 3 μm.

The second connection part 95 may be electrically connected to the first metal layer 35. The second connection part 95 may make contact with the first metal layer 35. One end of the second connection part 95 may be provided on the channel layer 30. The one end of the second connection part 95 may be spaced apart from the sidewall of the light emitting structure 10. The one end of the second connection part 95 may be exposed to the lateral side of the light emitting structure 10. The second connection part 95 may electrically connected to the first metal layer 35 through the channel layer 30. In addition, the second connection part 95 may be electrically connected to the first metal layer 35 through the insulating layer 40.

The second connection part 95 may be electrically connected to the second electrode 87. The second connection part 95 may make contact with the second electrode 87.

The first connection part 90 and the second connection part 95 may comprise at least one of Cr, V, W, Ti, Zn, Ni, Pt, Cu, Al, Au, and Mo.

In the light emitting device according to the embodiment, the conductive support member 70 provided under the second electrode 87 may be electrically connected to the first conductive semiconductor layer 11 provided on the second electrode 87.

Accordingly, power may be supplied to the first conductive semiconductor layer 11 through a scheme of attaching the conductive support member 70 to the bonding pad. According to the embodiment, the second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

In addition, according to the embodiment, the first electrodes 80 may be arranged in the form of dots at an outer peripheral region of the top surface of the light emitting structure 10, so that the light emission area can be expanded. According to the light emitting device of the embodiment, light absorption in the first electrode 80 may be reduced, so that the light efficiency can be improved.

Meanwhile, the process of forming each layer described above is illustrative purpose only, and the process sequence thereof may be variously modified.

Figure 8:
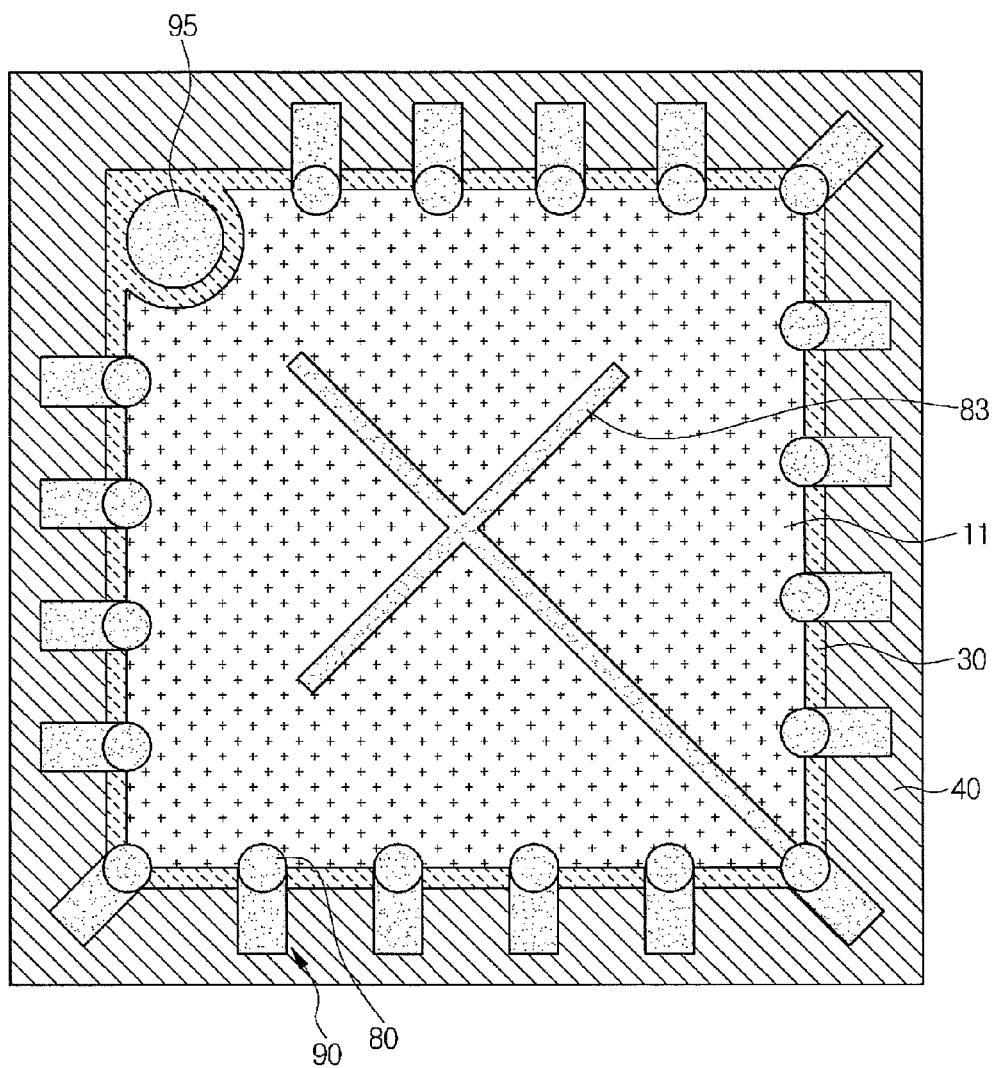
FIGS. 8 to 13 are sectional views showing another example of the light emitting device according to the embodiment.

FIG. 8 is a sectional view showing another example of a light emitting device according to the embodiment. The light emitting device shown in FIG. 8 may further comprise a branch electrode 83 when compared with the light emitting device shown in FIGS. 1 and 2. The branch electrode 83 may be disposed on a top surface of the light emitting structure 10. The branch electrode 83 may be disposed on a top surface of the first conductive semiconductor layer 11. The branch electrode 83 may be disposed on the central region of the first conductive semiconductor layer 11. The branch electrode 83 may make contact with one of the first electrodes 80. The branch electrode 83 may rapidly and uniformly distribute voltage applied to the first conductive semiconductor layer 11.

Figure 9:
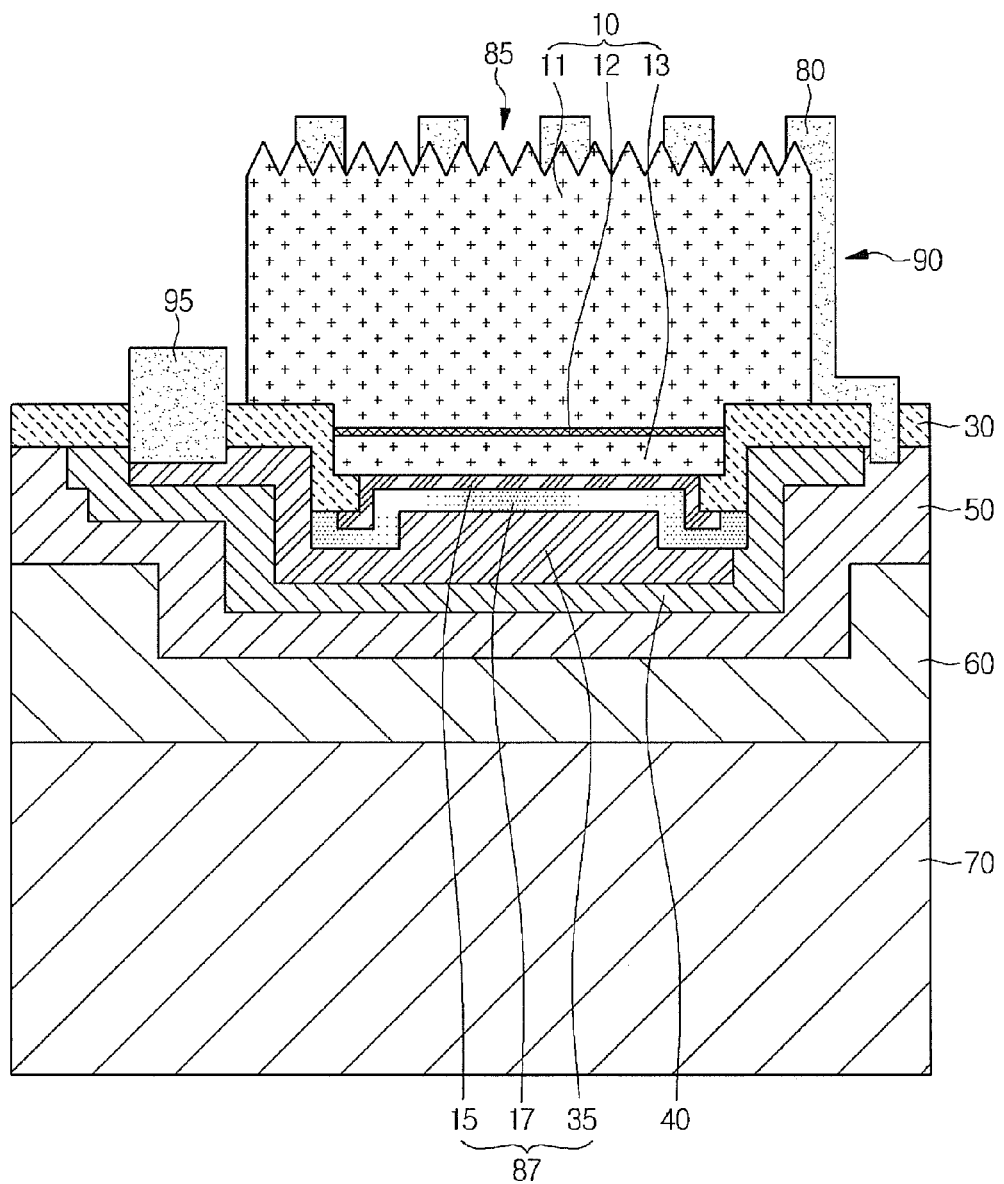

FIG. 9 is a sectional view showing another example of a light emitting device according to the embodiment. In the following description about the light emitting device shown in FIG. 9, components and structures the same as those described with reference to FIGS. 1 and 2 will not be further described in order to avoid redundancy.

According to the embodiment shown in FIG. 9, the channel layer 30 is provided around the peripheral portion of the lower portion of the light emitting structure 10, and the insulating layer 40 may not be exposed to the peripheral portion of the lower portion of the light emitting structure 10.

The light emitting device according to the embodiment may comprise the channel layer 30 provided at the peripheral portion of the lower portion of the light emitting structure 10. For example, the top surface the channel layer 30 may be provided higher than the top surface of the active layer 12. The channel layer 30 may surround the active layer 12. The channel layer 30 may surround a peripheral portion of the second conductive semiconductor layer 13. One end of the channel layer 30 may be provided under the second conductive semiconductor layer 13. The one end of the channel layer 30 may make contact with a bottom surface of the second conductive semiconductor layer 13. The one end of the channel layer 30 may be disposed between the second conductive semiconductor layer 13 and a reflective layer 17.

For example, the channel layer 30 may be realized by using an oxide or a nitride. For example, the channel layer 30 may comprise at least one selected from the group consisting of SiO2, SixOy, Si3N4, SixNy, SiOxNy, Al2O3, TiO2, and AlN. The channel layer 30 may be referred to as an isolation layer. The channel layer 30 may serve as an etching stopper when an isolation process is performed with respect to the light emitting structure 10 thereafter. In addition, through the isolation process, the electrical characteristic of the light emitting device can be prevented from being degraded.

The light emitting device according to the embodiment may comprise the insulating layer 40 disposed between the first metal layer 35 and the second metal layer 50. The insulating layer 40 may insulate the first metal layer 35 from the second metal layer 50. The insulating layer 40 may insulate the first metal layer 35 from the conductive support member 70. For example, the insulating layer 40 may be realized by using an oxide or a nitride. For example, the insulating layer 40 may comprise at least one selected from the group consisting of SiO2, SixOy, Si3N4, SixNy, SiOxNy, Al2O3, TiO2, and AlN.

The insulating layer 40 may surround a peripheral portion of the first metal layer 35. A portion of the insulating layer 40 may make contact with the lateral side of the reflective layer 17. The insulating layer 40 may surround a peripheral portion of the channel layer 30.

The light emitting device according to the embodiment may comprise the first connection part 90 and the second connection part 95. The first connection part 90 may be electrically connected to the first electrode 80 and the conductive support member 70. The second connection part 95 may be electrically connected to the reflective layer 17. According to the embodiment, the second electrode 87 may comprise at least one of the reflective layer 17, the ohmic contact layer 15, and the first metal layer 35.

A plurality of first electrodes 80 may be provided. In this case, the first electrodes 80 are spaced apart from each other on the top surface of the light emitting structure 10. In addition, the first electrodes 80 may be spaced apart from each other on the top surface of the first conductive semiconductor layer 11. The first electrodes 80 may be arranged in the form of dots on the first conductive semiconductor layer 11. Further, the first electrodes 80 may be formed on the first conductive semiconductor layer 11 with a width in the range of few micrometers to several tens of micrometers.

The first electrodes 80 may be arranged around the first conductive semiconductor layer 11. The first electrodes 80 may be arranged at an outer peripheral portion of the top surface of the first conductive semiconductor layer 11. The first electrodes 80 adjacent to each other may be spaced apart from each other by a distance of 100 μm to 500 μm.

A plurality of first connection parts 90 may be provided. Each of the first connection parts 90 may electrically connect the first electrodes 80 to the conductive support member 70. The second connection part 95 may be electrically connected to the reflective layer 17. The second connection part 95 may be electrically connected to the second electrode 87.

The first connection parts 90 may make contact with the first electrodes 80, respectively. The first connection parts 90 may be electrically connected to the second metal layer 50. The first connection part 90 may make contact with the second metal layer 50. The first connection part 90 may be electrically connected to the conductive support member 70 through the second metal layer 50 and the bonding layer 60.

The first connection parts 90 may be arranged at a lateral side of the light emitting structure 10. The first connection parts 90 may be spaced apart from each other. The first connection parts 90 may be arranged at a lateral side of the first conductive semiconductor layer 11 with a width in the range of few micrometers to several tens of micrometers.

The first connection parts 90 may be arranged at the lateral side of the first conductive semiconductor layer 11. The first connection parts 90 adjacent to each other may be spaced apart from each other by a distance of 100 μm to 500 μm.

The first connection part 90 may make contact with the first electrode 80. The first connection part 90 may be electrically connected to the second metal layer 50. The first connection part 90 may make contact with the second metal layer. The first connection part 90 may be electrically connected to the conductive support member 70 through the second metal layer 50 and the bonding layer 60. The first connection part 90 may be provided through the insulating layer 40. The first connection part 90 may be electrically connected to the conductive support member 70 through the insulating layer 40.

The first connection part 90 may be provided at the lateral side of the light emitting structure 10. The first connection part 90 may be provided at the lateral side of the first conductive semiconductor layer 11. The first connection part 90 may make contact with the lateral side of the first conductive semiconductor layer 11. The channel layer 30 may insulate the first connection part 90 from the active layer 12. The channel layer 30 may insulate the first connection part 90 from the second conductive semiconductor layer 13. The first connection part 90 may be spaced apart from the active layer 12 by a distance of at least 3 μm.

The second connection part 95 may be electrically connected to the first metal layer 35. The second connection part 95 may make contact with the first metal layer 35. One end of the second connection part 95 may be provided on the channel layer 30. The one end of the second connection part 95 may be spaced apart from the sidewall of the light emitting structure 10. The one end of the second connection part 95 may be exposed to the lateral side of the light emitting structure 10. The second connection part 95 may electrically connected to the first metal layer 35 through the channel layer 30.

The second connection part 95 may be electrically connected to the second electrode 87. The second connection part 95 may make contact with the second electrode 87.

The first connection part 90 and the second connection part 95 may comprise at least one of Cr, V, W, Ti, Zn, Ni, Pt, Cu, Al, Au, and Mo.

In the light emitting device according to the embodiment, the conductive support member 70 provided under the second electrode 87 may be electrically connected to the first conductive semiconductor layer 11 provided on the second electrode 87.

Accordingly, power may be supplied to the first conductive semiconductor layer 11 through a scheme of attaching the conductive support member 70 to the bonding pad. According to the embodiment, the second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

In addition, according to the embodiment, the first electrodes 80 may be arranged in the form of dots at an outer peripheral region of the top surface of the light emitting structure 10, so that the light emission area can be expanded. According to the light emitting device of the embodiment, light absorption in the first electrode 80 may be reduced, so that the light efficiency can be improved.

Figure 10:
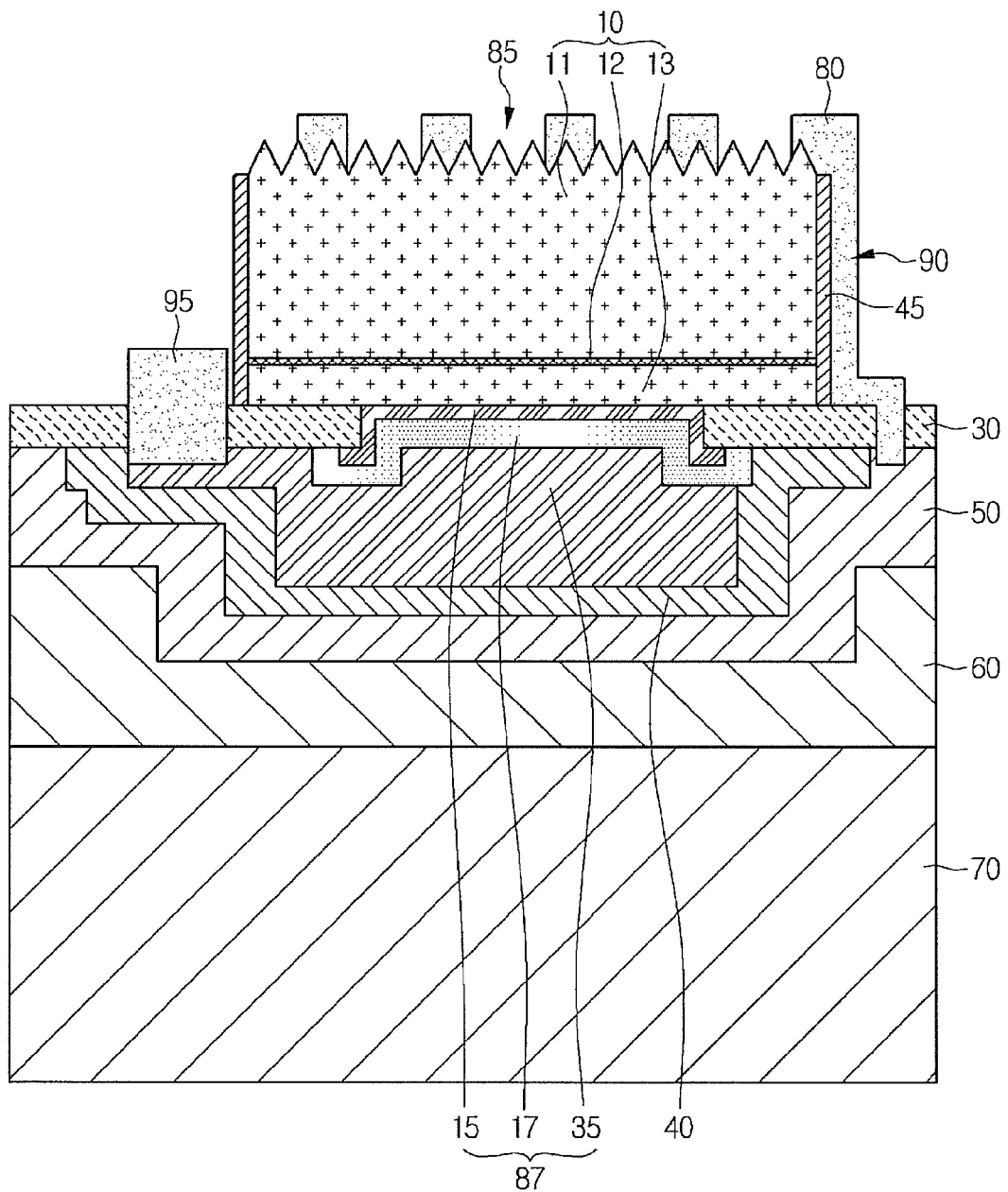

FIG. 10 is a sectional view showing still another example of a light emitting device according to the embodiment. In the following description about the light emitting device shown in FIG. 10, components and structures the same as those described with reference to FIGS. 1 and 2 will not be further described in order to avoid redundancy.

According to the embodiment shown in FIG. 10, a protective layer 45 may be provided at the lateral side of the light emitting structure 10. In addition, the channel layer 30 may be provided at the peripheral portion of the lower portion of the light emitting structure 10. The protective layer 45 may be disposed between the light emitting structure 10 and the first connection part 90. The protective layer 45 may insulate the first connection part 90 from the active layer 12. The protective layer 45 may insulate the first connection part 90 from the second conductive semiconductor layer 13.

For example, the protective layer 45 may be realized by using an oxide or a nitride. For example, the protective layer 45 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The light emitting device according to the embodiment may comprise the channel layer 30 provided around the lower portion of the light emitting structure 10. For example, the top surface of the channel layer 30 may be provided higher than the top surface of the active layer 12. One end of the channel layer 30 may be provided under the second conductive semiconductor layer 13. The one end of the channel layer 30 may make contact with a bottom surface of the second conductive semiconductor layer 13. The one end of the channel layer 30 may be disposed between the second conductive semiconductor layer 13 and the reflective layer 17. The one end of the channel layer 30 may be disposed between the second conductive semiconductor layer 13 and the second electrode 87.

For example, the channel layer 30 may be realized by using an oxide or a nitride. For example, the channel layer 30 may comprise at least one selected from the group consisting of $SiO_2$, $Si_xO_y$, $Si_3N_4$, $Si_xN_y$, $SiO_xN_y$, $Al_2O_3$, $TiO_2$, and AlN. The channel layer 30 may be referred to as an isolation layer. The channel layer 30 may serve as an etching stopper when an isolation process is performed with respect to the light emitting structure 10 thereafter. In addition, through the isolation process, the electrical characteristic of the light emitting device can be prevented from being degraded.

The light emitting device according to the embodiment may comprise the insulating layer 40 disposed between the first metal layer 35 and the second metal layer 50. The insulating layer 40 may insulate the first metal layer 35 from the second metal layer 50. The insulating layer 40 may insulate the first metal layer 35 from the conductive support member 70. For example, the insulating layer 40 may be realized by using an oxide or a nitride. For example, the insulating layer 40 may comprise at least one selected from the group consisting of $SiO_2$, $Si_xO_y$, $Si_3N_4$, $Si_xN_y$, $SiO_xN_y$, $Al_2O_3$, $TiO_2$, and AlN.

The insulating layer 40 may surround a peripheral portion of the first metal layer 35. A portion of the insulating layer 40 may make contact with the lateral side of the reflective layer 17. The top surface of the insulating layer 40 may be exposed to a peripheral portion of the lower portion of the light emitting structure 10. The insulating layer 40 may surround a peripheral portion of the channel layer 30.

The light emitting device according to the embodiment may comprise a first connection part 90 and a second connection part 95. The first connection part 90 may be electrically connected to the first electrode 80 and the conductive support member 70. The second connection part 95 may be electrically connected to the reflective layer 17. The second connection part 95 may electrically connected to the second electrode 87. According to the embodiment, the second electrode 87 may comprise at least one of the reflective layer 17, the ohmic contact layer 15, and the first metal layer 35.

A plurality of first electrodes 80 may be provided. In this case, the first electrodes 80 are spaced apart from each other on the top surface of the light emitting structure 10. In addition, the first electrodes 80 may be spaced apart from each other on the top surface of the first conductive semiconductor layer 11. The first electrodes 80 may be arranged in the form of dots on the first conductive semiconductor layer 11. Further, the first electrodes 80 may be formed on the first conductive semiconductor layer 11 with a width in the range of few micrometers to several tens of micrometers.

The first electrodes 80 may be arranged around the first conductive semiconductor layer 11. The first electrodes 80 may be arranged at an outer peripheral portion of the top surface of the first conductive semiconductor layer 11. The first electrodes 80 adjacent to each other may be spaced apart from each other by a distance of 100 μm to 500 μm.

A plurality of first connection parts 90 may be provided. Each of the first connection parts 90 may electrically connect the first electrodes 80 to the conductive support member 70. The second connection part 95 may be electrically connected to the reflective layer 17. The second connection part 95 may be electrically connected to the second electrode 87.

The first connection parts 90 may make contact with the first electrodes 80, respectively. The first connection parts 90 may be electrically connected to the second metal layer 50. The first connection part 90 may make contact with the second metal layer 50. The first connection part 90 may be electrically connected to the conductive support member 70 through the second metal layer 50 and the bonding layer 60.

The first connection parts 90 may be arranged at a lateral side of the light emitting structure 10. The first connection parts 90 may be spaced apart from each other. The first connection parts 90 may be arranged at a lateral side of the first conductive semiconductor layer 11 with a width in the range of few micrometers to several tens of micrometers.

The first connection parts 90 may be arranged at the lateral side of the first conductive semiconductor layer 11. The first connection parts 90 adjacent to each other may be spaced apart from each other by a distance of 100 μm to 500 μm.

The first connection part 90 may make contact with the first electrode 80. The first connection part 90 may be electrically connected to the second metal layer 50. The first connection part 90 may make contact with the second metal layer. The first connection part 90 may be electrically connected to the conductive support member 70 through the second metal layer 50 and the bonding layer 60. The first connection part 90 may be provided through the insulating layer 40. The first connection part 90 may be electrically connected to the conductive support member 70 through the insulating layer 40.

The first connection part 90 may be provided at the lateral side of the light emitting structure 10. The first connection part 90 may be provided at the lateral side of the first conductive semiconductor layer 11. The first connection part 90 may make contact with the lateral side of the first conductive semiconductor layer 11. The channel layer 30 may insulate the first connection part 90 from the active layer 12. The channel layer 30 may insulate the first connection part 90 from the second conductive semiconductor layer 13. The first connection part 90 may be spaced apart from the active layer 12 by a distance of at least 3 μm.

The second connection part 95 may be electrically connected to the first metal layer 35. The second connection part 95 may make contact with the first metal layer 35. One end of the second connection part 95 may be provided on the channel layer 30. The one end of the second connection part 95 may be spaced apart from the sidewall of the light emitting structure 10. The one end of the second connection part 95 may be exposed to the lateral side of the light emitting structure 10.

The second connection part 95 may be electrically connected to the second electrode 87. The second connection part 95 may make contact with the second electrode 87.

The first connection part 90 and the second connection part 95 may comprise at least one of Cr, V, W, Ti, Zn, Ni, Pt, Cu, Al, Au, and Mo.

In the light emitting device according to the embodiment, the conductive support member 70 provided under the second electrode 87 may be electrically connected to the first conductive semiconductor layer 11 provided on the second electrode 87.

Accordingly, power may be supplied to the first conductive semiconductor layer 11 through a scheme of attaching the conductive support member 70 to the bonding pad. According to the embodiment, the second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

In addition, according to the embodiment, the first electrodes 80 may be arranged in the form of dots at an outer peripheral region of the top surface of the light emitting structure 10, so that the light emission area can be expanded. According to the light emitting device of the embodiment, light absorption in the first electrode 80 may be reduced, so that the light efficiency can be improved.

Figure 11:
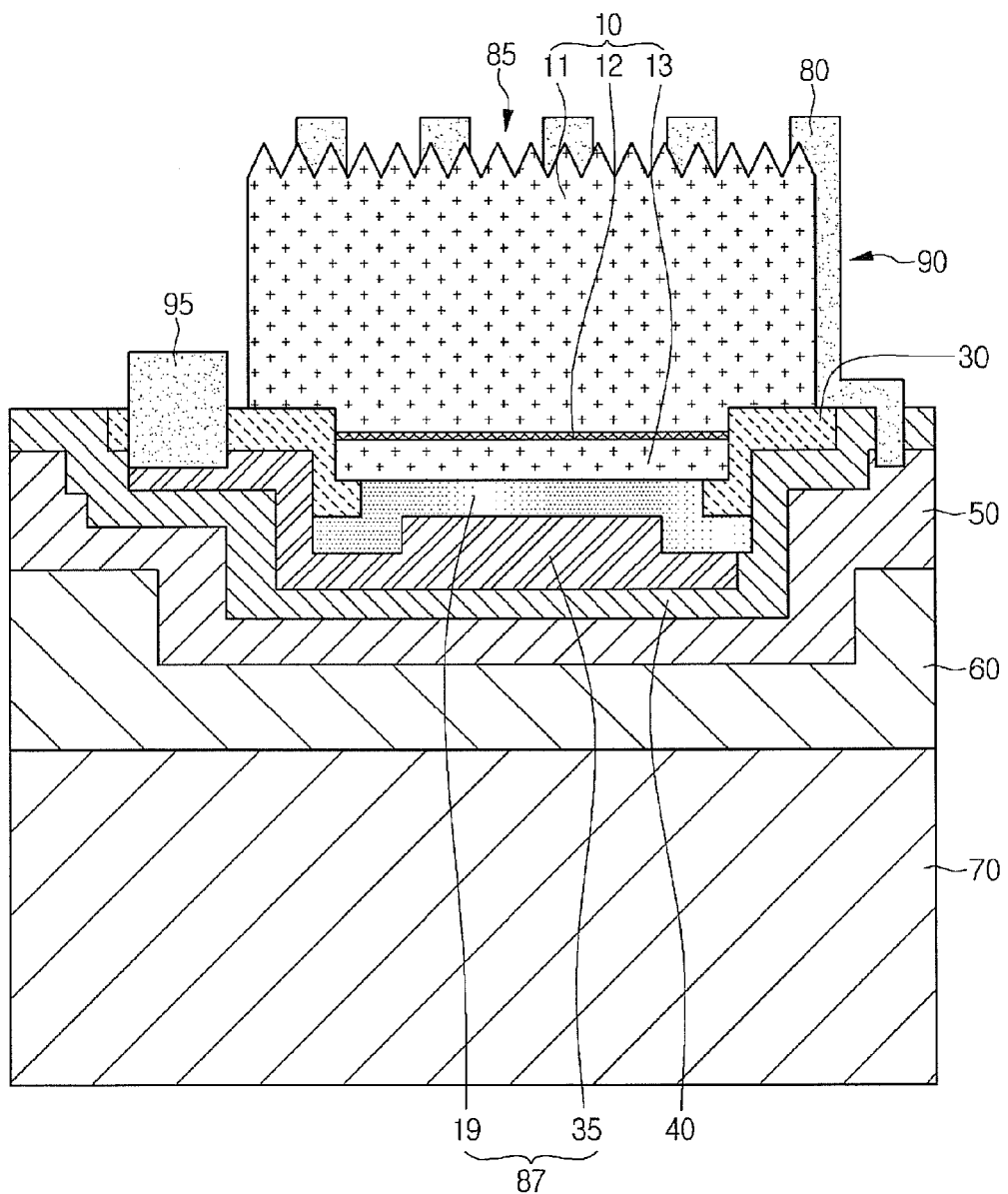

FIG. 11 is a sectional view showing still another example of a light emitting device according to the embodiment. In the following description about the light emitting device shown in FIG. 11, components and structures the same as those described with reference to FIGS. 1 and 2 will not be further described in order to avoid redundancy.

According to the light emitting device of the embodiment, an ohmic reflective layer 19 may be provided under the light emitting structure 10. The ohmic reflective layer 19 may be realized such that the ohmic reflective layer 19 serve as both of the reflective layer 17 and the ohmic contact layer 15. Accordingly, the ohmic reflective layer 19 may make ohmic-contact with the second conductive semiconductor layer 13, and reflect the light incident thereto from the light emitting structure 10.

In this case, the ohmic reflective layer 19 may comprise multiple layers. For example, the ohmic reflective layer 19 may have a structure in which an Ag layer and a Ni layer are alternately formed, or may comprise a Ni/Ag/Ni layer, a Ti layer, or a Pt layer.

According to the light emitting device of the embodiment, the conductive support member 70 provided under the ohmic reflective layer 19 may be electrically connected to the first conductive semiconductor layer 11 provided on the ohmic reflective layer 19.

The second electrode 87 according to the embodiment may comprise at least one of the ohmic reflective layer 19 and the first metal layer 35. In the light emitting device according to the embodiment, the conductive support member 70 provided under the second electrode 87 may be electrically connected to the first conductive semiconductor layer 11 provided on the second electrode 87 through the first electrode 80.

A plurality of first electrodes 80 may be provided. In this case, the first electrodes 80 are spaced apart from each other on the top surface of the light emitting structure 10. In addition, the first electrodes 80 may be spaced apart from each other on the top surface of the first conductive semiconductor layer 11. The first electrodes 80 may be arranged in the form of dots on the first conductive semiconductor layer 11. Further, the first electrodes 80 may be formed on the first conductive semiconductor layer 11 with a width in the range of few micrometers to several tens of micrometers.

The first electrodes 80 may be arranged around the first conductive semiconductor layer 11. The first electrodes 80 may be arranged at an outer peripheral portion of the top surface of the first conductive semiconductor layer 11. The first electrodes 80 adjacent to each other may be spaced apart from each other by a distance of 100 μm to 500 μm.

A plurality of first connection parts 90 may be provided. Each of the first connection parts 90 may electrically connect the first electrodes 80 to the conductive support member 70. The second connection part 95 may be electrically connected to the reflective layer 17. The second connection part 95 may be electrically connected to the second electrode 87.

The first connection parts 90 may make contact with the first electrodes 80, respectively. The first connection parts 90 may be electrically connected to the second metal layer 50. The first connection part 90 may make contact with the second metal layer 50. The first connection part 90 may be electrically connected to the conductive support member 70 through the second metal layer 50 and the bonding layer 60.

The first connection parts 90 may be arranged at a lateral side of the light emitting structure 10. The first connection parts 90 may be spaced apart from each other. The first connection parts 90 may be arranged at a lateral side of the first conductive semiconductor layer 11 with a width in the range of few micrometers to several tens of micrometers.

The first connection parts 90 may be arranged at the lateral side of the first conductive semiconductor layer 11. The first connection parts 90 adjacent to each other may be spaced apart from each other by a distance of 100 μm to 500 μm.

Accordingly, power may be supplied to the first conductive semiconductor layer 11 through a scheme of attaching the conductive support member 70 to the bonding pad. According to the embodiment, the second connection part 95 may be electrically connected to the ohmic reflective layer 19. In addition, the second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

In addition, according to the embodiment, the first electrodes 80 may be arranged in the form of dots at an outer peripheral region of the top surface of the light emitting structure 10, so that the light emission area can be expanded. According to the light emitting device of the embodiment, light absorption in the first electrode 80 may be reduced, so that the light efficiency can be improved.

Figure 12:
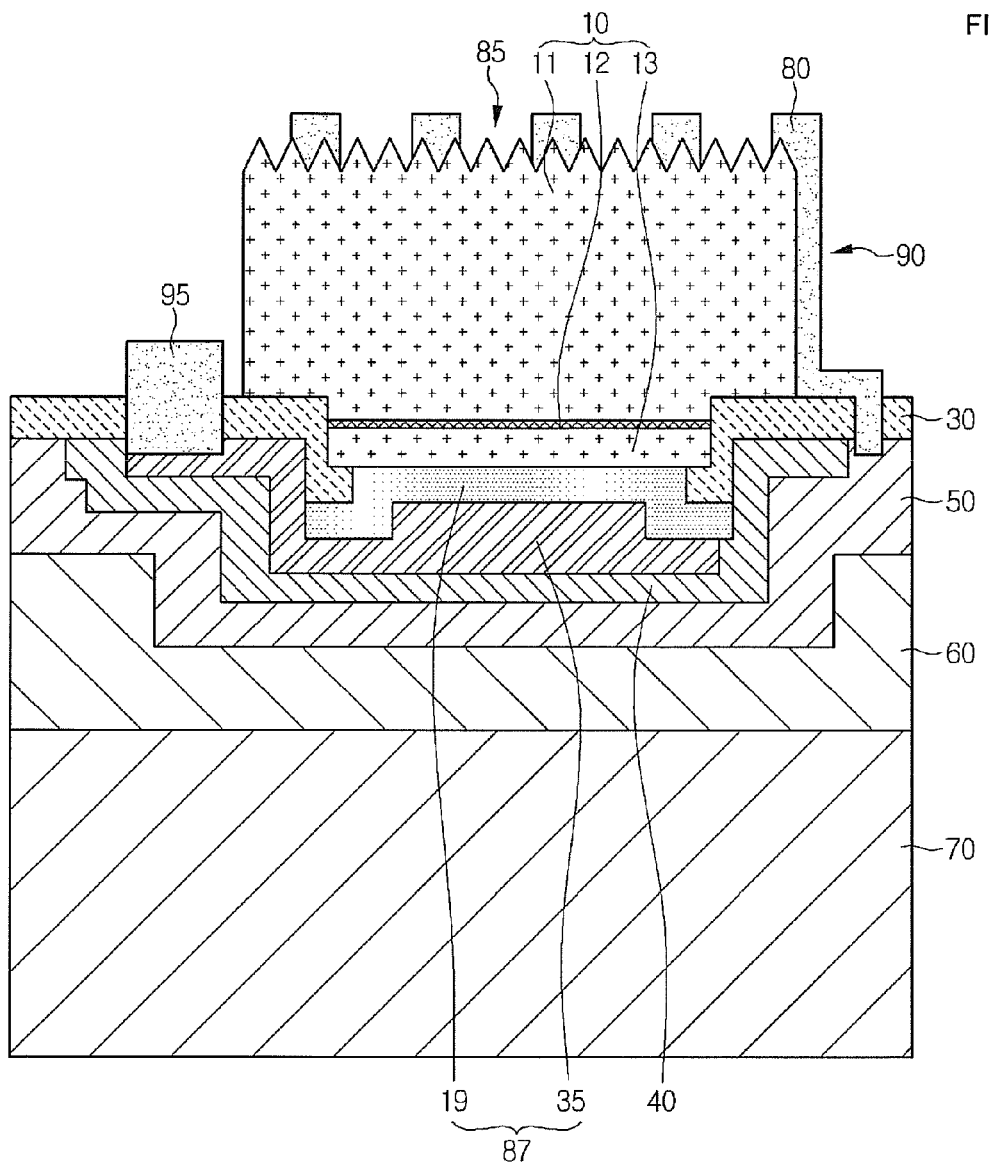

FIG. 12 is a sectional view showing still another example of a light emitting device according to the embodiment. In the following description about the light emitting device shown in FIG. 12, components and structures the same as those described with reference to FIG. 9 will not be further described in order to avoid redundancy.

According to the light emitting device of the embodiment, the ohmic reflective layer 19 may be provided under the light emitting structure 10. The ohmic reflective layer 19 may be realized such that the ohmic reflective layer 19 serve as both of the reflective layer 17 and the ohmic contact layer 15.

Accordingly, the ohmic reflective layer 19 may make ohmic contact with the second conductive semiconductor layer 13, and reflect the light incident thereto from the light emitting structure 10.

In this case, the ohmic reflective layer 19 may comprise multiple layers. For example, the ohmic reflective layer 19 may have a structure in which an Ag layer and an Ni layer are alternately formed, or may comprise a Ni/Ag/Ni layer, a Ti layer, or a Pt layer.

According to the light emitting device of the embodiment, the conductive support member 70 provided under the ohmic reflective layer 19 may be electrically connected to the first conductive semiconductor layer 11 provided on the ohmic reflective layer 19.

The second electrode 87 according to the embodiment may comprise at least one of the ohmic reflective layer 19 and the first metal layer 35. In the light emitting device according to the embodiment, the conductive support member 70 provided under the second electrode 87 may be electrically connected to the first conductive semiconductor layer 11 provided on the second electrode 87 through the first electrode 80.

A plurality of first electrodes 80 may be provided. In this case, the first electrodes 80 are spaced apart from each other on the top surface of the light emitting structure 10. In addition, the first electrodes 80 may be spaced apart from each other on the top surface of the first conductive semiconductor layer 11. The first electrodes 80 may be arranged in the form of dots on the first conductive semiconductor layer 11. Further, the first electrodes 80 may be formed on the first conductive semiconductor layer 11 with a width in the range of few micrometers to several tens of micrometers.

The first electrodes 80 may be arranged around the first conductive semiconductor layer 11. The first electrodes 80 may be arranged at an outer peripheral portion of the top surface of the first conductive semiconductor layer 11. The first electrodes 80 adjacent to each other may be spaced apart from each other by a distance of 100 μm to 500 μm.

A plurality of first connection parts 90 may be provided. Each of the first connection parts 90 may electrically connect the first electrodes 80 to the conductive support member 70. The second connection part 95 may be electrically connected to the reflective layer 17. The second connection part 95 may be electrically connected to the second electrode 87.

The first connection parts 90 may make contact with the first electrodes 80, respectively. The first connection parts 90 may be electrically connected to the second metal layer 50. The first connection part 90 may make contact with the second metal layer 50. The first connection part 90 may be electrically connected to the conductive support member 70 through the second metal layer 50 and the bonding layer 60.

The first connection parts 90 may be arranged at a lateral side of the light emitting structure 10. The first connection parts 90 may be spaced apart from each other. The first connection parts 90 may be arranged at a lateral side of the first conductive semiconductor layer 11 with a width in the range of few micrometers to several tens of micrometers.

The first connection parts 90 may be arranged at the lateral side of the first conductive semiconductor layer 11. The first connection parts 90 adjacent to each other may be spaced apart from each other by a distance of 100 μm to 500 μm.

Accordingly, power may be supplied to the first conductive semiconductor layer 11 through a scheme of attaching the conductive support member 70 to the bonding pad. According to the embodiment, the second connection part 95 may be electrically connected to the ohmic reflective layer 19. In addition, the second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

In addition, according to the embodiment, the first electrodes 80 may be arranged in the form of dots at an outer peripheral region of the top surface of the light emitting structure 10, so that the light emission area can be expanded. According to the light emitting device of the embodiment, light absorption in the first electrode 80 may be reduced, so that the light efficiency can be improved.

Figure 13:
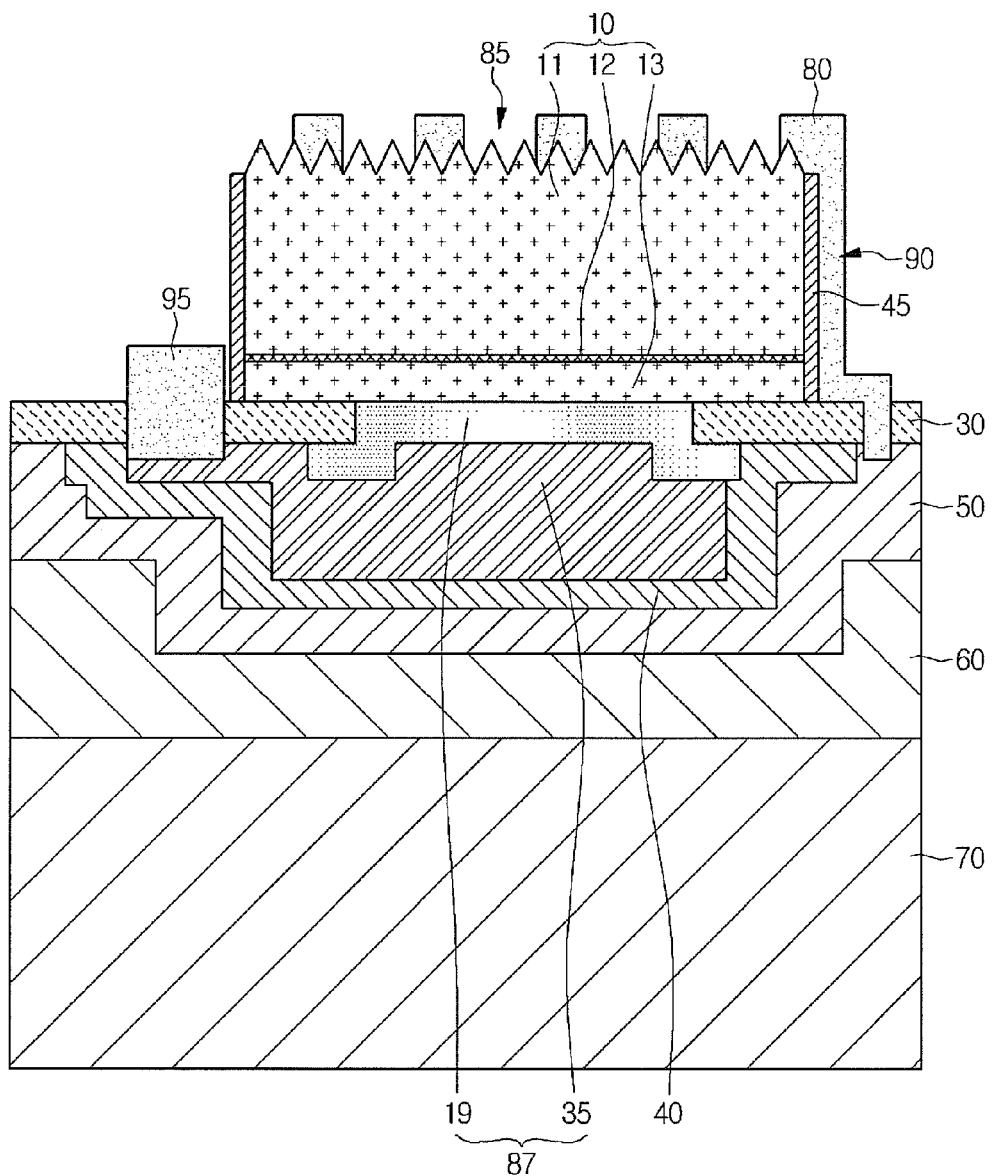

FIG. 13 is a sectional view showing still another example of a light emitting device according to the embodiment. In the following description about the light emitting device shown in FIG. 13, components and structures the same as those described with reference to FIG. 10 will not be further described in order to avoid redundancy.

According to the light emitting device of the embodiment, the ohmic reflective layer 19 may be provided under the light emitting structure 10. The ohmic reflective layer 19 may be realized such that the ohmic reflective layer 19 serve as both of the reflective layer 17 and the ohmic contact layer 15. Accordingly, the ohmic reflective layer 19 may make ohmic contact with the second conductive semiconductor layer 13, and reflect the light incident thereto from the light emitting structure 10.

In this case, the ohmic reflective layer 19 may comprise multiple layers. For example, the ohmic reflective layer 19 may have a structure in which an Ag layer and an Ni layer are alternately formed, or may comprise a Ni/Ag/Ni layer, a Ti layer, or a Pt layer.

According to the light emitting device of the embodiment, the conductive support member 70 provided under the ohmic reflective layer 19 may be electrically connected to the first conductive semiconductor layer 11 provided on the ohmic reflective layer 19 through the first electrode 80.

A plurality of first electrodes 80 may be provided. In this case, the first electrodes 80 are spaced apart from each other on the top surface of the light emitting structure 10. In addition, the first electrodes 80 may be spaced apart from each other on the top surface of the first conductive semiconductor layer 11. The first electrodes 80 may be arranged in the form of dots on the first conductive semiconductor layer 11. Further, the first electrodes 80 may be formed on the first conductive semiconductor layer 11 with a width in the range of few micrometers to several tens of micrometers.

The first electrodes 80 may be arranged around the first conductive semiconductor layer 11. The first electrodes 80 may be arranged at an outer peripheral portion of the top surface of the first conductive semiconductor layer 11. The first electrodes 80 adjacent to each other may be spaced apart from each other by a distance of 100 μm to 500 μm.

A plurality of first connection parts 90 may be provided. Each of the first connection parts 90 may electrically connect the first electrodes 80 to the conductive support member 70. The second connection part 95 may be electrically connected to the reflective layer 17. The second connection part 95 may be electrically connected to the second electrode 87.

The first connection parts 90 may make contact with the first electrodes 80, respectively. The first connection parts 90 may be electrically connected to the second metal layer 50. The first connection part 90 may make contact with the second metal layer 50. The first connection part 90 may be electrically connected to the conductive support member 70 through the second metal layer 50 and the bonding layer 60.

The first connection parts 90 may be arranged at a lateral side of the light emitting structure 10. The first connection parts 90 may be spaced apart from each other. The first connection parts 90 may be arranged at a lateral side of the first conductive semiconductor layer 11 with a width in the range of few micrometers to several tens of micrometers.

The first connection parts 90 may be arranged at the lateral side of the first conductive semiconductor layer 11. The first connection parts 90 adjacent to each other may be spaced apart from each other by a distance of 100 µm to 500 µm.

The second electrode 87 according to the embodiment may comprise at least one of the ohmic reflective layer 19 and the first metal layer 35. In the light emitting device according to the embodiment, the conductive support member 70 provided under the second electrode 87 may be electrically connected to the first conductive semiconductor layer 11 provided on the second electrode 87.

Accordingly, power may be supplied to the first conductive semiconductor layer 11 through a scheme of attaching the conductive support member 70 to the bonding pad. According to the embodiment, the second connection part 95 may be electrically connected to the ohmic reflective layer 19. In addition, the second connection part 95 may be electrically connected to the second electrode 87. Therefore, the second connection part 95 is connected to a power pad through a wire bonding scheme, thereby supplying power to the second conductive semiconductor layer 13.

According to the light emitting device of the embodiment, power may be supplied to the light emitting structure 10 through the conductive support member 70 and the second connection part 95. Therefore, according to the embodiment, current concentration can be prevented, and the electrical reliability can be improved.

In addition, according to the embodiment, the first electrodes 80 may be arranged in the form of dots at an outer peripheral region of the top surface of the light emitting structure 10, so that the light emission area can be expanded. According to the light emitting device of the embodiment, light absorption in the first electrode 80 may be reduced, so that the light efficiency can be improved.

Figure 14:
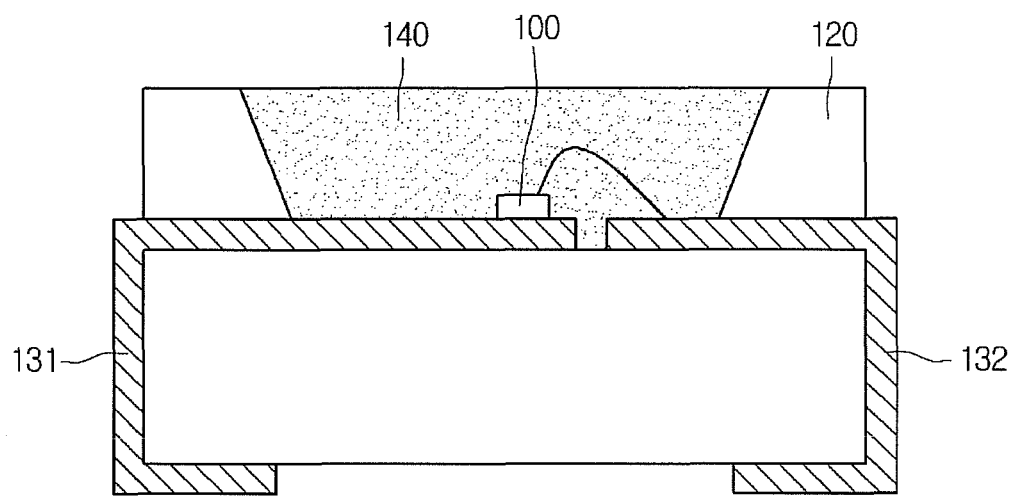
FIG. 14 is a sectional view showing a light emitting device package according to the embodiment.

FIG. 14 is a sectional view showing a light emitting device package to which the light emitting device according to the embodiment is applied.

Referring to FIG. 14, the light emitting device package according to the embodiment may comprise a body 120, first and second lead electrodes 131 and 132 formed on the body 120, a light emitting device 100 provided on the body 120 and electrically connected to the first and second lead electrodes 131 and 132 and a molding member 140 that surrounds the light emitting device 100.

The body 120 may comprise silicon, synthetic resin or metallic material, and an inclined surface may be formed in the vicinity of the light emitting device 100.

The first and second lead electrodes 131 and 132 are electrically isolated from each other to supply power to the light emitting device 100. The first and second lead electrode 131 and 132 can improve the light efficiency by reflecting the light emitted from the light emitting device 100. Further, the first and second lead electrodes 131 and 132 dissipate heat generated from the light emitting device 100 to the outside.

The light emitting device 100 can be installed on the body 120 or the first or second lead electrode 131 or 132.

The light emitting device 100 may be electrically connected to the first and second lead electrodes 131 and 132 through one of a wire scheme, a flip-chip scheme, and a die-bonding scheme.

The molding member 140 may surround the light emitting device 100 to protect the light emitting device 100. In addition, the molding member 140 may comprise phosphors to change the wavelength of the light emitted from the light emitting device 100.

A plurality of light emitting device or light emitting device packages according to the embodiment may be arrayed on a board, and an optical member comprising a lens, a light guide plate, a prism sheet, or a diffusion sheet may be provided on the optical path of the light emitted from the light emitting device package. The light emitting device package, the board, and the optical member may serve as a light unit. The light unit is realized in a top view type or a side view type and variously provided in display devices of a portable terminal and a laptop computer or a lighting apparatus and an indicator apparatus. In addition, a lighting apparatus according to another embodiment can comprise a light emitting device, or a light emitting device package according to the embodiment. For example, the lighting apparatus may comprise a lamp, a signal lamp, an electric sign board and a headlight of a vehicle.

Figure 16:
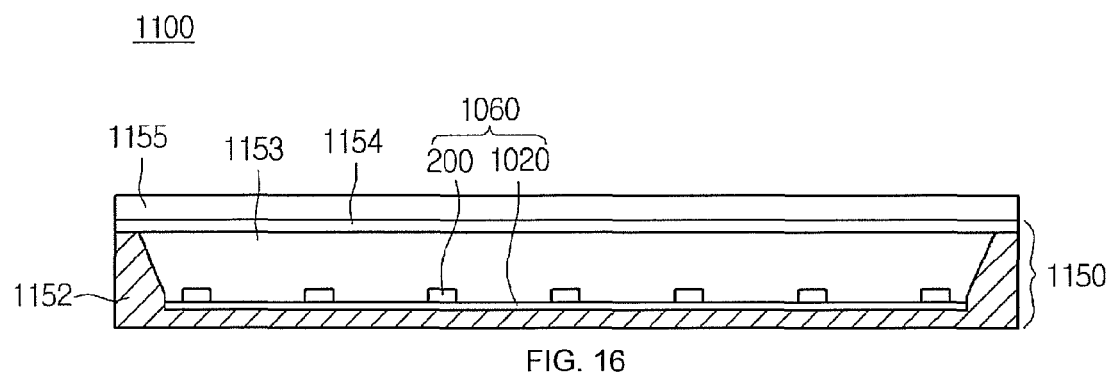
FIG. 16 is a sectional view showing another example of the display device according to the embodiment.
Figure 17:
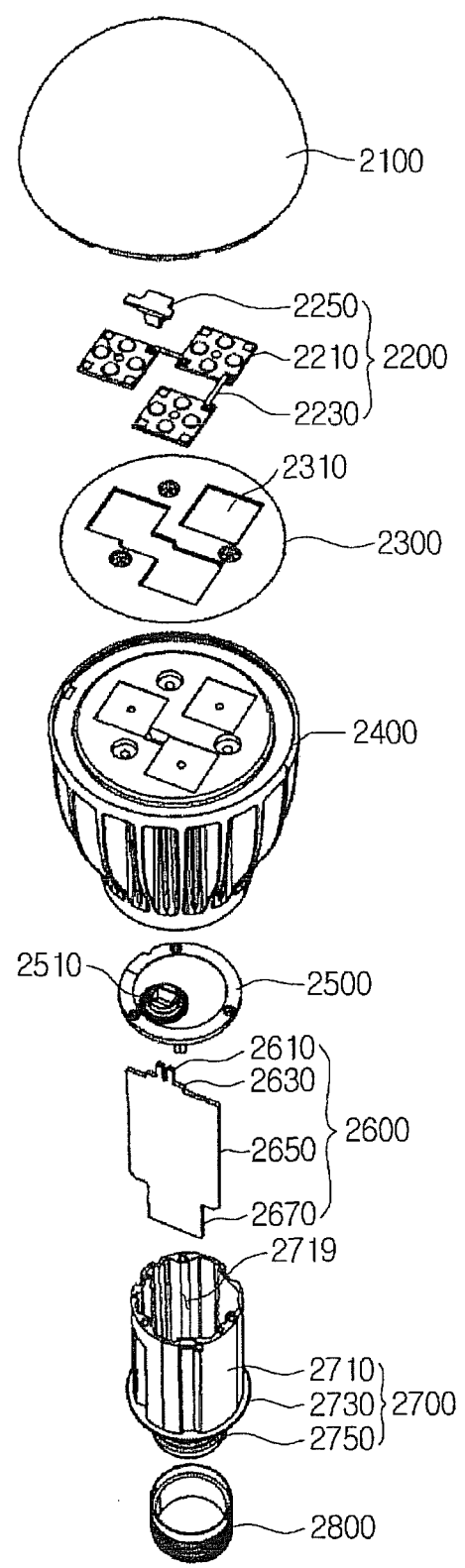
FIG. 17 is an exploded perspective view showing a light unit according to the embodiment.

The light emitting device according to the embodiment may be applied to the light unit. The light unit has a structure in which a plurality of light emitting devices are arrayed. The light unit may comprise a display device as shown in FIGS. 15 and 16 and the lighting apparatus as shown in FIG. 17.

Figure 15:
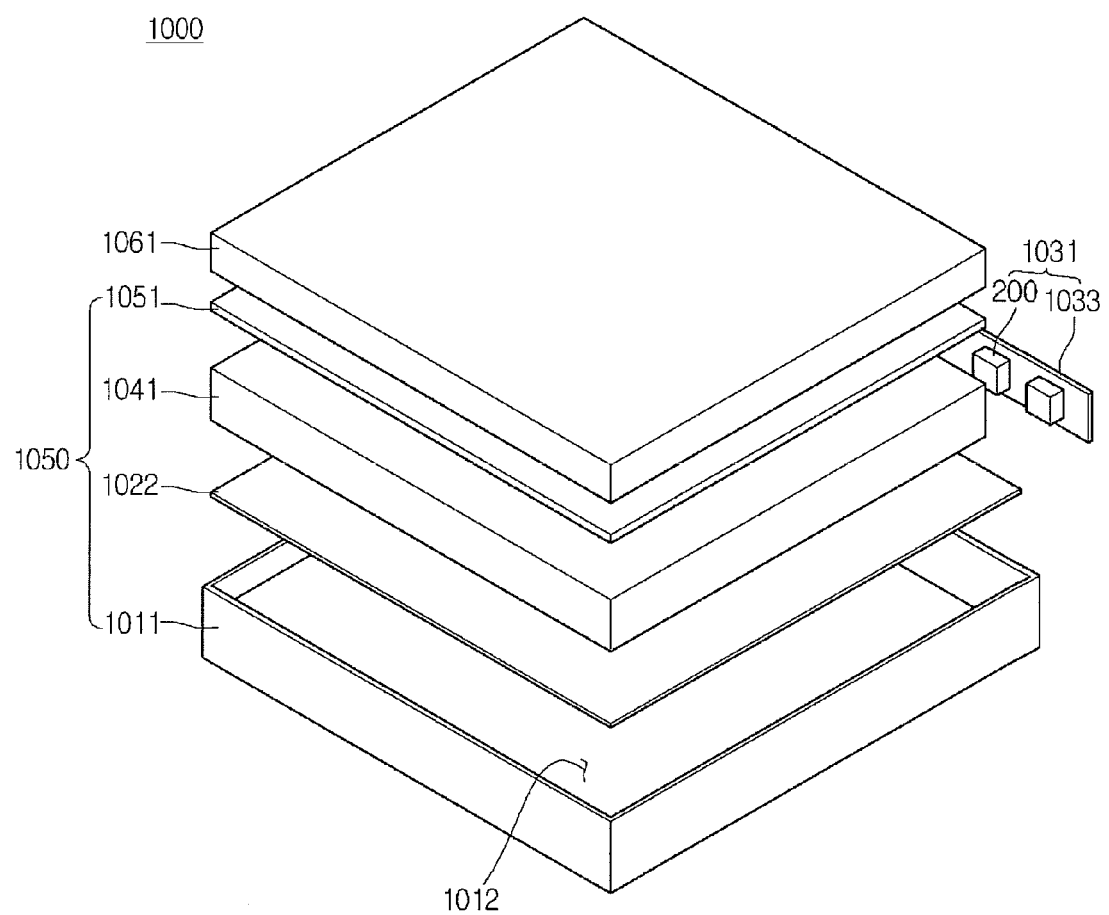
FIG. 15 is an exploded perspective view showing a display device according to the embodiment.

Referring to FIG. 15, a display device 1000 according to the embodiment comprises a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective member 1022, the light guide plate 1041 and the optical sheet 1051 may constitute a light unit 1050.

The light guide plate 1041 diffuses the light to provide surface light. The light guide plate 1041 may comprise transparent material. For example, the light guide plate 1041 may comprise one of acryl-based resin, such as PMMA (polymethyl methacrylate), PET (polyethylene terephthalate), PC (polycarbonate), COC (cyclic olefin copolymer) and PEN (polyethylene naphthalate) resin.

The light emitting module 1031 supplies the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may comprise a board 1033 and light emitting devices 100 or the light emitting device package 200 according to the embodiment described above. The light emitting packages 200 may be arrayed on the board 1033 while being spaced apart from each other at the predetermined interval.

The board 1033 may be a printed circuit board (PCB) comprising a circuit pattern. In addition, the board 1033 may also comprise a metal core PCB (MCPCB) or a flexible PCB (FPCB) as well as the PCB, but the embodiment is not limited thereto. If the light emitting device packages 200 are installed on the lateral side of the bottom cover 1011 or on a heat dissipation plate, the board 1033 may be omitted. The heat dissipation plate may partially make contact with the top surface of the bottom cover 1011.

In addition, the light emitting device packages 200 are installed such that light exit surfaces of the light emitting device packages 200 are spaced apart from the light guide plate 1041 at a predetermined distance, but the embodiment is not limited thereto. The light emitting device packages 200 may directly or indirectly supply the light to a light incident part, which is one side of the light guide plate 1041, but the embodiment is not limited thereto.

The reflective member 1022 may be disposed below the light guide plate 1041. The reflective member 1022 reflects the light, which travels downward through the bottom surface of the light guide plate 1041, upward, thereby improving the brightness of the light unit 1050. For example, the reflective member 1022 may comprise PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may comprise metal or non-metallic material having superior thermal conductivity, but the embodiment is not limited thereto.

The display panel 1061, for example, is an LCD panel comprising first and second transparent substrates, which are opposite to each other, and a liquid crystal layer disposed between the first and second substrates. A polarizing plate can be attached to at least one surface of the display panel 1061, but the embodiment is not limited thereto. The display panel 1061 displays information by using light passing through the optical sheet 1051. The display device 1000 can be applied to various portable terminals, monitors of notebook computers and laptop computers, and televisions.

The optical sheet 1051 is disposed between the display panel 1061 and the light guide plate 1041 and comprises at least one transmissive sheet. For example, the optical sheet 1051 comprises at least one of a diffusion sheet, horizontal and vertical prism sheets, and a brightness enhanced sheet. The diffusion sheet diffuses the incident light, the horizontal and/or vertical prism sheet concentrates the incident light onto a display region, and the brightness enhanced sheet improves the brightness by reusing the light to be lost. In addition, a protective sheet can be provided on the display panel 1061, but the embodiment is not limited thereto.

The light guide plate 1041 and the optical sheet 1051 can be provided on the optical path of the light emitting module 1031 as optical members, but the embodiment is not limited thereto.

FIG. 16 is a sectional view showing another example of a display device according to the embodiment.

Referring to FIG. 16, the display device 1100 comprises a bottom cover 1152, a board 1020 on which the light emitting devices 100 are arrayed, an optical member 1154, and a display panel 1155.

The board 1020 and the light emitting device packages 200 may constitute a light emitting module 1060. In addition, the bottom cover 1152, at least one light emitting module 1060, and the optical member 1154 may constitute the light unit.

The bottom cover 1152 can be provided therein with a receiving section 1153, but the embodiment is not limited thereto.

In this case, the optical member 1154 may comprise at least one of a lens, a light guide plate, a diffusion sheet, horizontal and vertical prism sheets, and a brightness enhanced sheet. The light guide plate may comprise PC or PMMA (Poly methyl methacrylate). The light guide plate can be omitted. The diffusion sheet diffuses the incident light, the horizontal and vertical prism sheets concentrate the incident light onto a display region, and the brightness enhanced sheet improves the brightness by reusing the light to be lost.

The optical member 1154 is disposed above the light emitting module 1060 in order to convert the light emitted from the light emitting module 1060 into the surface light. In addition, the optical member 1154 may diffuse or collect the light.

FIG. 17 is a perspective view showing a lighting apparatus according to the embodiment.

Referring to FIG. 17, the lighting apparatus according to the embodiment may comprise a cover 2100, a light source module 2200, a radiator 2400, a power supply part 2600, an inner case 2700, and a socket 2800. The lighting apparatus according to the embodiment may further comprise at least one of a member 2300 and a holder 2500. The light source module 2200 may comprise the light emitting device package according to the embodiment.

For example, the cover 2100 may have a bulb shape or a hemispheric shape. The cover 2100 may have a hollow structure which is partially open. The cover 2100 may be optically coupled with the light source module 2200. For example, the cover 2100 may diffuse, scatter, or excite light provided from the light source module 2200. The cover 2100 may be an optical member. The cover 2100 may be coupled with the radiator 2400. The cover 2100 may comprise a coupling part which is coupled with the radiator 2400.

The cover 2100 may comprise an inner surface coated with a milk-white pigment. The milk-white pigment may comprise a diffusion material to diffuse light. The roughness of the inner surface of the cover 2100 may be greater than the roughness of the outer surface of the cover 2100. The surface roughness is provided for the purpose of sufficiently scattering and diffusing the light from the light source module 2200.

The cover 2100 may comprise glass, plastic, polypropylene (PP), polyethylene (PE) or polycarbonate (PC). The polycarbonate (PC) has the superior light resistance, heat resistance and strength among the above materials. The cover 2100 may be transparent so that a user may view the light source module 2200 from the outside, or may be opaque. The cover 2100 may be formed through a blow molding scheme.

The light source module 220 may be disposed at one surface of the radiator 2400. Accordingly, the heat from the light source module 220 is transferred to the radiator 2400. The light source module 2200 may comprise a light source 2210, a connection plate 2230, and a connector 2250.

The member 2300 is disposed on a top surface of the radiator 2400, and comprises guide grooves 2310 into which a plurality of light sources 2210 and the connector 2250 are inserted. The guide grooves 2310 correspond to a board of the light source 2210 and the connector 2250.

A surface of the member 2300 may be coated with a light reflective material. For example, the surface of the member 2300 may be coated with white pigment. The member 2300 reflects again light, which is reflected by the inner surface of the cover 2100 and is returned to the direction of the light source module 2200, to the direction of the cover 2100.

Accordingly, the light efficiency of the lighting apparatus according to the embodiment may be improved.

For example, the member 2300 may comprise an insulating material. The connection plate 2230 of the light source module 2200 may comprise an electrically conductive material. Accordingly, the radiator 2400 may be electrically connected to the connection plate 2230. The member 2300 may be formed by an insulating material, thereby preventing the connection plate 2230 from being electrically shorted with the radiator 2400. The radiator 2400 receives heat from the light source module 2200 and the power supply part 2600 and dissipates the heat.

The holder 2500 covers a receiving groove 2719 of an insulating part 2710 of an inner case 2700. Accordingly, the power supply part 2600 received in the insulating part 2710 of the inner case 2700 is sealed. The holder 2500 comprises a guide protrusion 2510. The guide protrusion 2510 has a hole and a protrusion of the power supply part 2600 extends by passing through the hole.

The power supply part 2600 processes or converts an electric signal received from the outside and provides the processed or converted electric signal to the light source module 2200. The power supply part 2600 is received in the receiving groove 2719 of the inner case 2700, and is sealed inside the inner case 2700 by the holder 2500.

The power supply part 2600 may comprise a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed on one surface of the base 2650. For example, the components may comprise a DC converter to convert AC power provided from an external power supply into DC power, a driving chip to control the driving of the light source module 2200, and an electrostatic discharge (ESD) protection device to protect the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may comprise a molding part therein together with the power supply part 2600. The molding part is prepared by hardening molding liquid, and the power supply part 2600 may be fixed inside the inner case 2700 by the molding part.

An embodiment provides a light emitting device capable of preventing current concentration, and improving electrical reliability and light efficiency, a light emitting device package, and a light unit.

A light emitting device according to an embodiment comprises a light emitting structure having a first conductive semiconductor layer, an active layer under the first conductive semiconductor layer, and a second conductive semiconductor layer under the active layer; a plurality of first electrodes disposed on the first conductive semiconductor layer; a second electrode electrically connected to the second conductive semiconductor layer; a conductive support member disposed under the second electrode; a plurality of first connection parts electrically connecting the first electrodes to the conductive support member, respectively; and a second connection part electrically connected to the second electrode, wherein the first electrodes are spaced apart from each other on a top surface of the first conductive semiconductor layer.

A light emitting device according to an embodiment comprises a light emitting structure having a first conductive semiconductor layer, an active layer under the first conductive semiconductor layer, and a second conductive semiconductor layer under the active layer; a plurality of first electrodes disposed on the first conductive semiconductor layer; a second electrode electrically connected to the second conductive semiconductor layer; a conductive support member disposed under the second electrode; a plurality of first connection parts electrically connecting the first electrodes to the conductive support member, respectively; and a second connection part electrically connected to the second electrode, wherein the first electrodes are arranged around the first conductive semiconductor layer, the first electrodes are spaced apart from each other on the first conductive semiconductor layer, and the first connection parts are arranged at a lateral side of the light emitting structure.

A light emitting device according to an embodiment comprises a light emitting structure having a first conductive semiconductor layer, an active layer under the first conductive semiconductor layer, and a second conductive semiconductor layer under the active layer; a plurality of first electrodes disposed on the first conductive semiconductor layer; a second electrode electrically connected to the second conductive semiconductor layer; a conductive support member disposed under the second electrode; a plurality of first connection parts electrically connecting the first electrodes to the conductive support member, respectively; and a second connection part electrically connected to the second electrode, wherein the first electrodes are spaced apart from each other on the first conductive semiconductor layer, a top surface of the channel layer is higher than a top surface of the active layer, and the channel layer surrounds the active layer.

A light emitting device, a light emitting device package and a light unit according to the embodiment can prevent current concentration and improve electrical reliability and light efficiency.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure including a first conductive semiconductor layer and a second conductive semiconductor layer, and an active layer between the first conductive semiconductor layer and the second conductive semiconductor layer;
a plurality of first electrodes on the first conductive semiconductor layer;
a second electrode electrically connected to the second conductive semiconductor layer;
a conductive support member under the second electrode;
a plurality of first connection parts electrically connecting the first electrodes to the conductive support member, respectively; and
a second connection part electrically connected to the second electrode,
wherein the first electrodes are spaced apart from each other on a top surface of the first conductive semiconductor layer, and
wherein the plurality of first connection parts contact a lateral side of the first conductive semiconductor layer.

2. The light emitting device of claim 1, wherein the first electrodes are arranged in a form of dots on the first conductive semiconductor layer.

3. The light emitting device of claim 1, wherein the first electrodes are arranged around the first conductive semiconductor layer.

4. The light emitting device of claim 1, wherein the first electrodes adjacent to each other are spaced apart from each other by a distance of about 100 µm to about 500 µm.

5. The light emitting device of claim 1, wherein the first connection parts are arranged at a lateral side of the light emitting structure.

6. The light emitting device of claim 5, wherein the first connection parts are spaced apart from each other.

7. The light emitting device of claim 1, further comprising a channel layer around a lower portion of the light emitting structure, wherein one end of the second connection part is provided on the channel layer.

8. The light emitting device of claim 7, wherein the one end of the second connection part is spaced apart from a sidewall of the light emitting structure and is exposed to a lateral side of the light emitting structure.

9. The light emitting device of claim 7, wherein a top surface of the channel layer is higher than a top surface of the active layer.

10. The light emitting device of claim 1, wherein the second electrode comprises a metal layer under the second conductive semiconductor layer, and the second connection part is electrically connected to the metal layer.

11. The light emitting device of claim 10, further comprising an insulating layer disposed between the metal layer and the conductive support member.

12. The light emitting device of claim 11, wherein a top surface of the insulating layer is exposed to a peripheral portion of a lower portion of the light emitting structure.

13. The light emitting device of claim 11, wherein the first connection part is electrically connected to the conductive support member through the insulating layer.

14. The light emitting device of claim 7, wherein the channel layer surrounds the active layer.

15. The light emitting device of claim 7, wherein the channel layer surrounds the second conductive semiconductor layer.

16. A light emitting device comprising:
a light emitting structure including a first conductive semiconductor layer and a second conductive semiconductor layer, and an active layer between the first conductive semiconductor layer and the second conductive semiconductor layer;
a plurality of first electrodes on the first conductive semiconductor layer;
a second electrode electrically connected to the second conductive semiconductor layer;
a conductive support member under the second electrode;
a plurality of first connection parts electrically connecting the first electrodes to the conductive support member, respectively; and
a second connection part electrically connected to the second electrode,
wherein the first electrodes are arranged around the first conductive semiconductor layer,
wherein the first electrodes are spaced apart from each other on the first conductive semiconductor layer,
wherein the first connection parts are arranged at a lateral side of the light emitting structure, and
wherein the plurality of first connection parts contact a lateral side of the first conductive semiconductor layer.

17. The light emitting device of claim 16, wherein the first connection parts are spaced apart from each other.

18. A light emitting device comprising:
a light emitting structure including a first conductive semiconductor layer and a second conductive semiconductor layer, and an active layer between the first conductive semiconductor layer and the second conductive semiconductor layer;
a plurality of first electrodes on the first conductive semiconductor layer;
a second electrode electrically connected to the second conductive semiconductor layer;
a conductive support member under the second electrode;
a plurality of first connection parts electrically connecting the first electrodes to the conductive support member, respectively, wherein the plurality of first connection parts contact a lateral side of the first conductive semiconductor layer;
a channel layer disposed around a lower portion of the light emitting structure; and
a second connection part electrically connected to the second electrode,
wherein the first electrodes are spaced apart from each other on the first conductive semiconductor layer,
wherein a portion of a top surface of the channel layer is higher than a top surface of the active layer,
wherein the channel layer surrounds the active layer, and
wherein one end of the channel layer is disposed under the second conductive semiconductor layer.

19. The light emitting device of claim 18, wherein the channel layer surrounds the second conductive semiconductor layer.

20. The light emitting device of claim 18, further comprising a reflective layer disposed under the light emitting structure,
wherein one end of the channel layer is disposed between the second conductive semiconductor layer and the reflective layer.

* * * * *